United States Patent
Tanaka

(10) Patent No.: US 9,591,244 B2
(45) Date of Patent: Mar. 7, 2017

(54) SOLID-STATE IMAGING DEVICE HAVING PLURAL HYBRID PIXELS WITH DUAL STORING FUNCTION

(71) Applicant: FUJIFILM Corporation, Tokyo (JP)

(72) Inventor: Syunsuke Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 101 days.

(21) Appl. No.: 14/744,677

(22) Filed: Jun. 19, 2015

(65) Prior Publication Data

US 2015/0288901 A1 Oct. 8, 2015

Related U.S. Application Data

(63) Continuation of application No. PCT/JP2013/082772, filed on Dec. 6, 2013.

(30) Foreign Application Priority Data

Dec. 21, 2012 (JP) ................. 2012-279535

(51) Int. Cl.
*H01L 27/146* (2006.01)
*H04N 5/369* (2011.01)
*H04N 5/232* (2006.01)

(52) U.S. Cl.
CPC ....... *H04N 5/3696* (2013.01); *H01L 27/1464* (2013.01); *H01L 27/14605* (2013.01);
(Continued)

(58) Field of Classification Search
CPC ............... H04N 5/235; H04N 5/35554; H01L 27/14621; H01L 27/14647; H01L 27/14634; H01L 27/14603
(Continued)

(56) References Cited

U.S. PATENT DOCUMENTS 7,411,620 B2 * 8/2008 Taniguchi ......... H01L 27/14621
257/E27.15
8,772,892 B2 7/2014 Okigawa
(Continued)

FOREIGN PATENT DOCUMENTS

JP 1-215063 A 8/1989
JP 2007-325139 A 12/2007
(Continued)

OTHER PUBLICATIONS

International Search Report for PCT/JP2013/082772 mailed on Jan. 21, 2014.
(Continued)

*Primary Examiner* — Que T Le
(74) *Attorney, Agent, or Firm* — Birch, Stewart, Kolash & Birch, LLP

(57) ABSTRACT

A solid-state imaging device comprises a plurality of hybrid pixels. The hybrid pixel comprises a photodiode, which has a charge storage region and a photoelectric conversion region, and a transparent electrode. The transparent electrode applies a voltage to the charge storage region to modulate a potential with respect to a charge. Thereby the width of the charge storage region is reduced to form an effective charge storage region. Unless potentially modulated, the hybrid pixel functions as a normal pixel. Upon the potential modulation, the hybrid pixel functions as a phase detection pixel, which selectively stores the charge generated in a part of the photoelectric conversion region.

10 Claims, 20 Drawing Sheets

(52) U.S. Cl.
CPC ... *H01L 27/14621* (2013.01); *H04N 5/23212* (2013.01); *H01L 27/14627* (2013.01)

(58) Field of Classification Search
USPC .............. 250/208.1, 214 R, 239, 214.1; 257/290–292, 440–444; 348/294–311
See application file for complete search history.

(56) References Cited

U.S. PATENT DOCUMENTS

| 2009/0086063 A1 | 4/2009 | Suzuki et al. |
| 2009/0290059 A1 | 11/2009 | Suzuki |
| 2013/0258097 A1 | 10/2013 | Yamada |

FOREIGN PATENT DOCUMENTS

| JP | 2008-193527 A | 8/2008 |
| JP | 2012-3009 A | 1/2012 |
| JP | 2013-153050 A | 8/2013 |
| WO | WO 2012/026292 A1 | 3/2012 |

OTHER PUBLICATIONS

Written Opinion of the International Searching Authority for PCT/JP2013/082772 mailed on Jan. 21, 2014.
Japanese Office Action, dated Aug. 19, 2015, for corresponding Japanese Application No. 2014-553074, with an English translation.

\* cited by examiner

FIG. 5
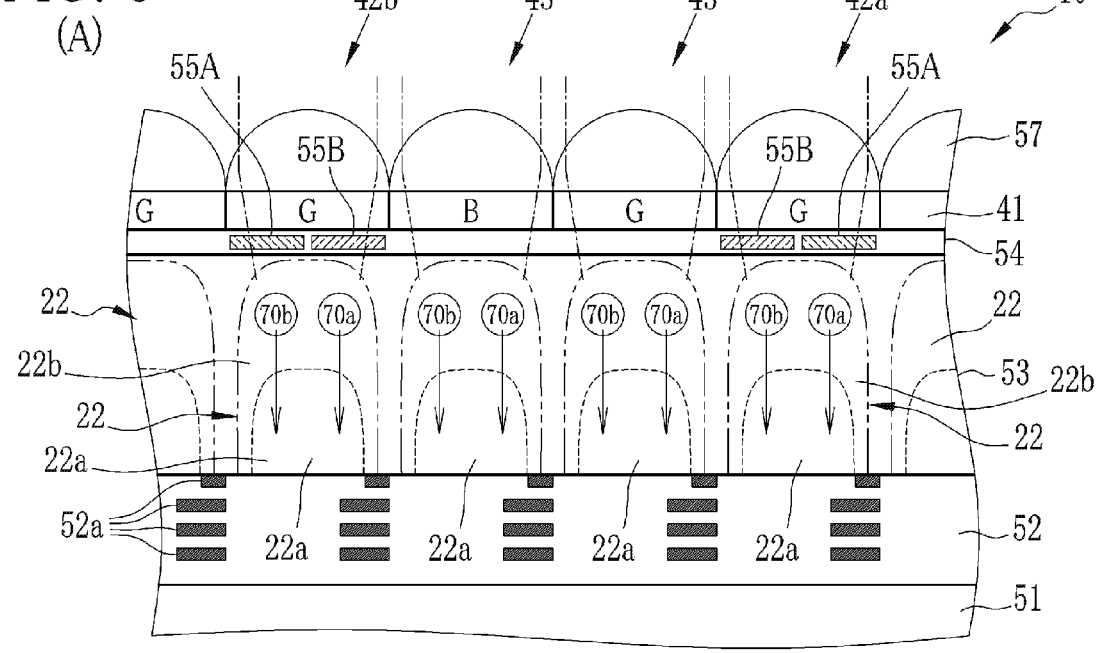
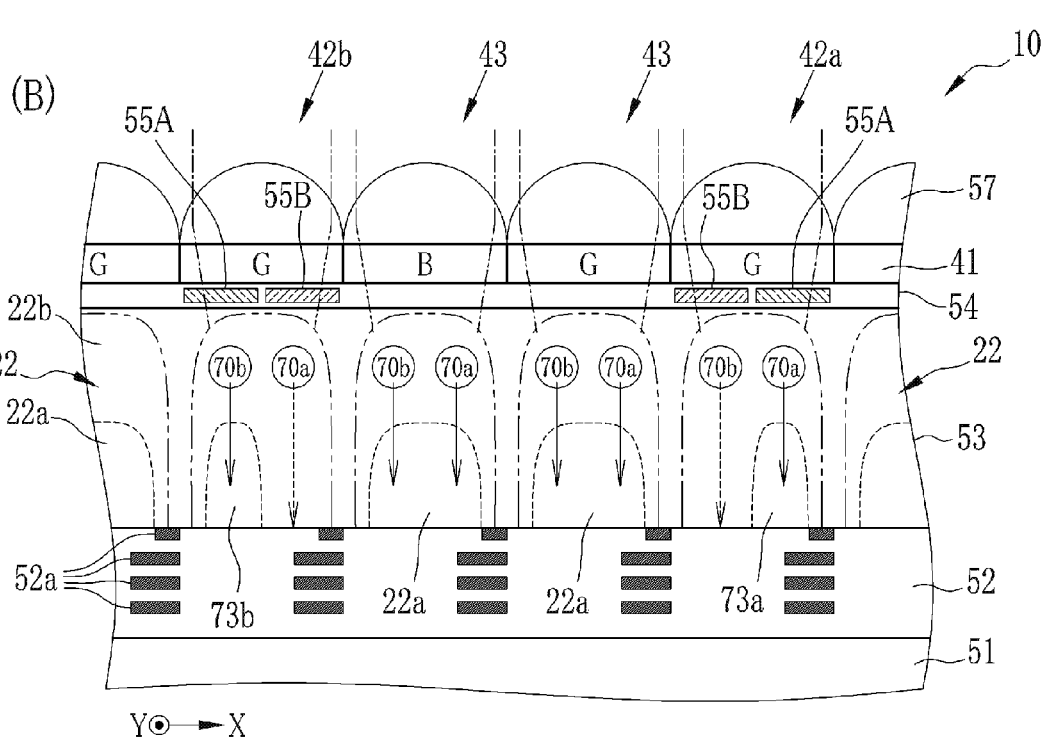

SOLID-STATE IMAGING DEVICE HAVING PLURAL HYBRID PIXELS WITH DUAL STORING FUNCTION

CROSS-REFERENCE TO RELATED APPLICATIONS

This application is a Continuation of PCT International Application No. PCT/JP2013/082772 filed on Dec. 6, 2013, which claims priority under 35 U.S.C. §119(a) to Japanese Patent Application No. 2012-279535, filed Dec. 21, 2012. Each of the above application(s) is hereby expressly incorporated by reference, in its entirety, into the present application.

BACKGROUND OF THE INVENTION

1. Field of the Invention

The present invention relates to a solid-state imaging device capable of focus adjustment of a phase detection method.

2. Description Related to the Prior Art

An autofocusing function has become a standard feature of camera modules of mobile electronic devices such as digital cameras, mobile phones, and smartphones. Types of autofocusing functions include a contrast detection type (the so-called contrast AF) that performs focus adjustment to make the contrast of the image maximum and a phase detection type (hereinafter referred to as the phase detection AF) that performs the focus adjustment based on a phase difference caused by parallax. Although the contrast AF requires finding an inflection point while a taking lens is moved, the phase detection AF enables fast autofocusing because it detects the focus state at each lens position.

For example, as described in Japanese Patent Laid-Open Publication No. 2012-003009, in the solid-state imaging device which performs the phase detection AF, two types of phase detection pixels (right phase detection pixels and left phase detection pixels) are disposed in a predetermined pattern. Each of the two types of the phase detection pixels selectively receives the light incident from right or left direction. The focus adjustment is performed by calculating information related to the phase difference based on pixel signals (pixel values) obtained from the two types of phase detection pixels and driving the taking lens so as to reduce the phase difference. In the Japanese Patent Laid-Open Publication No. 2012-003009, the phase detection pixel is formed by making the color filter asymmetrical in a left-right (side-to-side) direction. A phase detection pixel with an opening off-centered relative to the center of a corresponding photodiode and a phase detection pixel formed by making an inner-layer lens asymmetrical have also been known.

A monocular 3D imaging device that takes two perspective images for stereoscopy at a time with one solid-state imaging device has been known. All of the pixels disposed in the light receiving area of this solid-state imaging device are perspective pixels each with two photodiodes placed side by side behind one on-chip microlens. Each of the two photodiodes has approximately half the size of that of a normal pixel. The two photodiodes constitute a right perspective pixel portion for imaging a right perspective image and a left perspective pixel portion for imaging a left perspective image (see U.S. Pat. No. 8,772,892 corresponding to WO 2012/026292).

A solid-state imaging device in which phase detection pixels (hereinafter may referred to as the measurement pixels) are arranged at predetermined positions in the light receiving area has been known. Each measurement pixel is provided with two or more transparent electrodes for control so as to virtually divide one measurement pixel into two or more regions (see Japanese Patent Laid-Open Publication No. 1-215063). In the measurement pixel, each transparent electrode is controlled independently, so that a signal is read out independently from each region, to be used for metering and color temperature detection.

Each phase detection pixel has a shape asymmetrical in, for example, the left-right direction, so that a pixel signal obtained from the phase detection pixel differs from that obtained from a symmetrically-shaped normal pixel. For this reason, the pixel signal of the phase detection pixel cannot be used for producing a normal image in a case where an image of a subject is taken after the phase detection AF. It is necessary to generate the pixel signal, for the normal image, corresponding to the position of the phase detection pixel through gain correction of the pixel signal of the phase detection pixel or interpolation using the pixel signals of the adjacent normal pixels. In the case where the pixel signal for the normal image is generated by the gain correction or the interpolation, sensitivity or resolution of the pixel corresponding to the position of the phase detection pixel may be substantially reduced depending on the specific properties of the subject and accuracy of the gain correction, the interpolation, or the like.

Some of the current camera modules, digital cameras, and the like are provided with a mode for taking a movie and a mode for performing pixel addition. However, the solid-state imaging device having the phase detection pixels may not be allowed to adopt such modes because the phase detection pixels may degrade the image quality of normal images. The accurate focus adjustment by the phase detection AF may sacrifice some of other convenient features of the solid-state imaging device.

In a 3D imaging device with the phase detection pixels disposed all over the light receiving area, the phase detection AF is performed by using signals from right pixel portions and signals from left pixel portions. In order to produce a normal image (2D image), it is necessary to use one of right perspective image and left perspective image or average or add the pixel signals of the right and left pixel portions. In this case, however, the number of pixels for producing the normal image is half the total number of the left and right pixel portions arranged in the light receiving area, so that the resolution of the normal image becomes low. Each of the right and left perspective images is produced using pixel signals all obtained from the asymmetrically-shaped pixels. As a result, the sensitivity is inferior to that of the case where imaging is performed with the normal pixels, which receive light evenly from every direction.

With regard to the measurement pixel described in Japanese Patent Laid-Open Publication No. 1-215063, one pixel is virtually divided into two or more regions. For example, a signal is taken out separately from each of a right half region and a left half region of a pixel to perform the phase detection AF. However, color filters of different colors are disposed to the respective regions, so that the signal the same as that of the normal pixel cannot be obtained even if the signals are read out from each region of the measurement pixel at the time of producing a normal image. Even in the Japanese Patent Laid-Open Publication No. 1-215063, the correction of the pixel signal from the measurement pixel is necessary to obtain the pixel signal for producing a normal image, resulting in partial reduction in resolution and sensitivity.

SUMMARY OF THE INVENTION

An object of the present invention is to provide a solid-state imaging device which inhibits reductions in sensitivity and resolution even if pixel signals for a normal image are generated from pixels used for phase detection AF.

In order to achieve the above and other objects, the solid-state imaging device of the present invention comprises a plurality of hybrid pixels each comprising a photoelectric conversion region, a charge storage region, and a potential modulation electrode. The photoelectric conversion region photoelectrically converts incident light from a subject into a charge corresponding to an amount of the incident light. The charge storage region stores the charge generated in the photoelectric conversion region. The potential modulation electrode applies a voltage to the charge storage region to modulate a potential with respect to the charge and thereby narrows a width of the charge storage region to locally form the charge storage region. Each hybrid pixel functions as a normal pixel for evenly storing the charge generated in the photoelectric conversion region in a case where the width of the charge storage region is not narrowed. Each hybrid pixel functions as a phase detection pixel for selectively storing the charge generated in a part of the photoelectric conversion region in a case where the voltage is applied to the potential modulation electrode to narrow the width of the charge storage region. The hybrid pixel comprises two or more photodiodes. Each photodiode has the photoelectric conversion region and the charge storage region. An amount of a dopant is greater in an isolation region for interfering with charge transfer between the photodiodes than in an isolation region for interfering with charge transfer between the adjacent pixels. Thereby, the potential with respect to the charge is higher in the isolation region for interfering with the charge transfer between the photodiodes than in the isolation region for interfering with the charge transfer between the adjacent pixels.

It is preferred that the potential modulation electrode has two or more electrodes to each of which a voltage is applied independently. By applying a negative voltage to at least one of the electrodes, the charge storage region is locally formed below the other of the electrodes. It is preferred to apply a positive voltage to the electrode which corresponds to a position where the charge storage region is to be locally formed.

It is preferred that the potential modulation electrode has first and second electrodes whose application voltages are controllable. There are two types of hybrid pixels: first and second hybrid pixels. In the first hybrid pixel, the first electrode and the second electrode are arranged in this order in a first direction. In the second hybrid pixel, the first and second electrodes are arranged in a reverse order to the order in the first hybrid pixel. A first voltage is applied to the first electrode of each of the first and second hybrid pixels. A second voltage is applied to the second electrode of each of the first and second hybrid pixels.

It is preferred that the potential modulation electrode has three or more electrodes arranged in the first direction.

It is preferred to form an image of a subject on a light receiving area with a zooming lens capable of adjusting a focal length. In the light receiving area, a plurality of pixels including the hybrid pixels are arranged. The application voltages applied to the respective electrodes arranged in the first direction are changed in accordance with the focal length of the zooming lens, thereby changing a position where the charge storage region is locally formed.

It is preferred that the hybrid pixels include first to fourth hybrid pixels. The potential modulation electrode has four electrodes (first to fourth electrodes) whose application voltages are controllable. The same voltage is applied to the first electrodes, the second electrodes, the third electrodes, and the fourth electrodes of the first to fourth hybrid pixels. In the first hybrid pixel, the first to fourth electrodes are arranged two-dimensionally in the first direction and a second direction orthogonal to the first direction. An arrangement of the first to fourth electrodes in the second hybrid pixel and an arrangement of the first to fourth electrodes in the first hybrid pixel are symmetric with respect to the first direction. An arrangement of the first to fourth electrodes in the third hybrid pixel and an arrangement of the first to fourth electrodes in the second hybrid pixel are symmetric with respect to the second direction. An arrangement of the first to fourth electrodes in the fourth hybrid pixel and an arrangement of the first to fourth electrodes in the third hybrid pixel are symmetric with respect to the first direction.

It is preferred that a position where the charge storage region is locally formed is changed in accordance with a position of the hybrid pixel in the light receiving area.

It is preferred that the solid-state imaging device further comprises a microlens, which collects the incident light in the photodiode, for the each hybrid pixel. The potential modulation electrode is formed from an opaque material and provided outside of a light collecting area in which the incident light is collected by the microlens.

It is preferred that the potential modulation electrode has a shape with a cutout portion that exposes the light collecting area.

The hybrid pixel according to the present invention performs the potential modulation of the charge storage region to narrow the width of the charge storage region. Thereby, the hybrid pixel serves both as the normal pixel and as the phase detection pixel. As a result, the phase detection AF is performed with high accuracy and reductions in sensitivity and resolution are inhibited in generating pixel signals of a normal image.

BRIEF DESCRIPTION OF THE DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein:

FIG. 5 is an explanatory view illustrating an operation of the solid-state imaging device;

DESCRIPTION OF THE PREFERRED EMBODIMENTS

First Embodiment

Figure 1:
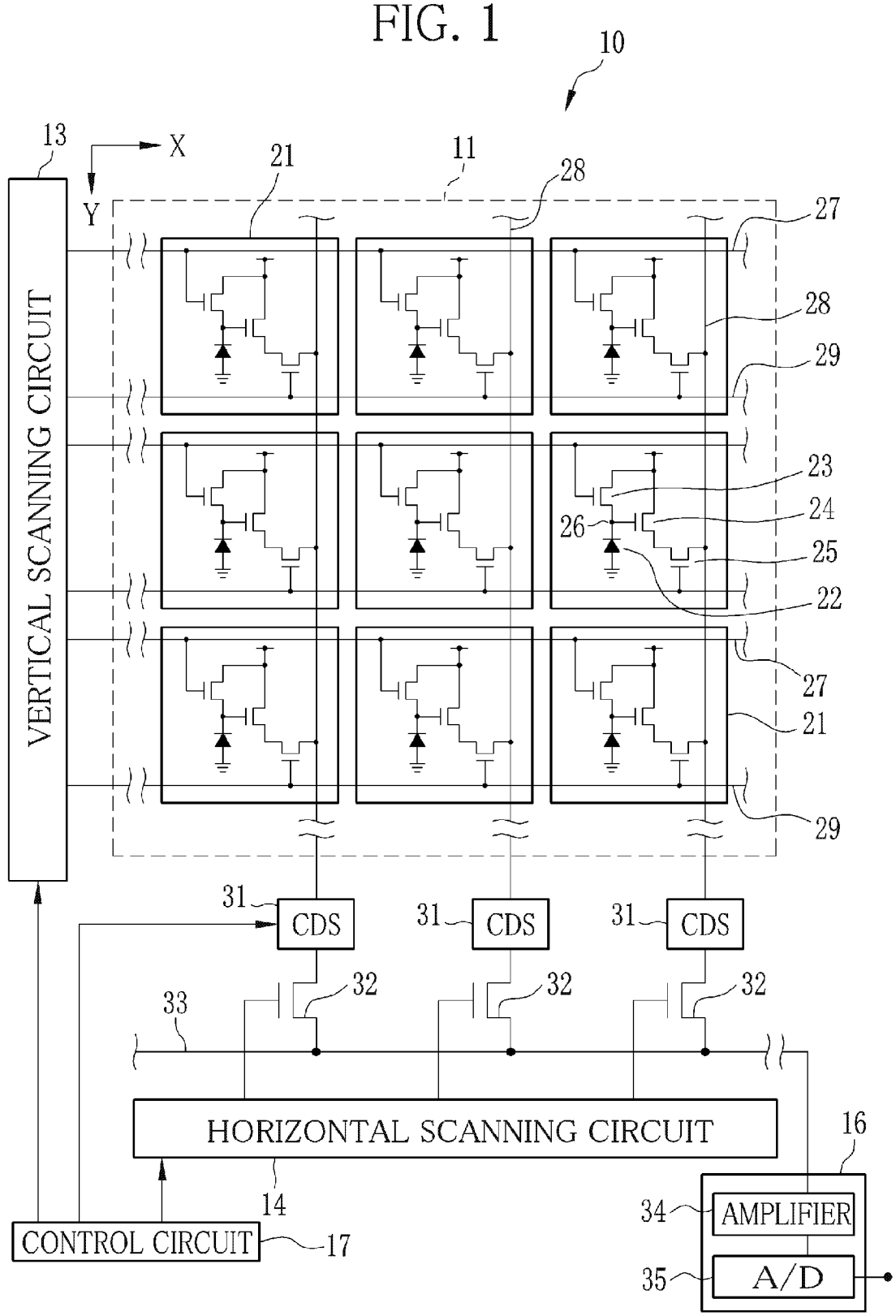
FIG. 1 is an explanatory view illustrating a solid-state imaging device of a present invention.

In FIG. 1, a solid-state imaging device 10 is a CMOS image sensor, which comprises a light receiving area 11, a vertical scanning circuit 13, a horizontal scanning circuit 14, an output circuit 16, a control circuit 17, and the like.

A plurality of pixels 21 are arranged in a square matrix in horizontal direction (X direction) and vertical direction (Y direction) in the light receiving area 11. A taking lens forms an image of a subject on the light receiving area 11. Each pixel 21 generates a charge corresponding to an amount of incident light through photoelectric conversion and stores the charge.

The pixel 21 comprises a photodiode (PD) 22, a reset transistor (hereinafter abbreviated as "Tr") 23, an amplifying transistor (hereinafter abbreviated as "Ta") 24, and a select transistor (hereinafter abbreviated as "Ts") 25. The "Tr" 23, the "Ta" 24, and the "Ts" 25 are n-type MOS transistors, for example. Each pixel 21 is provided with a color filter 41 (see FIG. 2) of red (R), green (G), or blue (B), and photoelectrically converts the light of the same color as that of the color filter 41 into a charge.

Figure 2:
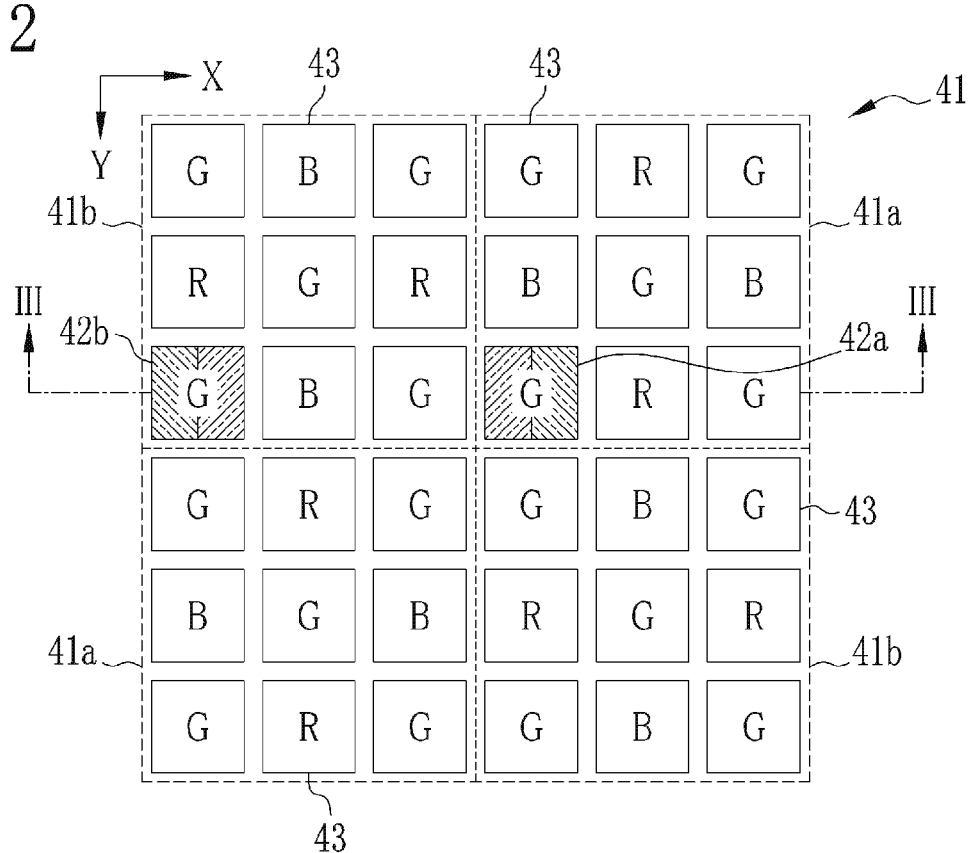
FIG. 2 is an explanatory view illustrating an arrangement of color filters.

The pixels 21 are composed of normal pixels 43 and hybrid pixels 42a and 42b (see FIG. 2). The normal pixels 43 are arranged symmetrically in the horizontal and vertical directions. The normal pixels 43 are used for taking a normal image of a subject. The hybrid pixels 42a and 42b serve as phase detection pixels for obtaining information related to parallax in a left-right direction (side-to-side direction or horizontal direction), and also serve as pixels for taking a normal image. The normal pixel 43 differs from the hybrid pixels 42a and 42b in spatial structure (more specifically, the difference is the presence or absence of transparent electrodes 55A and 55B (see FIG. 3)). However, the normal pixels 43 and the hybrid pixels 42a and 42b have the same basic electrical configuration with regard to the photoelectric conversion of the incident light, the storage of charges, and reading of the charges. For this reason, in FIG. 1, the normal pixels 43 and the hybrid pixels 42a and 42b are referred to as the pixels 21 without distinction.

The PD 22 photoelectrically converts the incident light to generate a charge (electron-hole pairs) corresponding to the amount of the incident light. The anode of the PD 22 is connected to ground. The cathode of the PD 22 is connected to a gate electrode of the Ta 24. A floating diffusion (hereinafter abbreviated as FD) 26 is a component where the cathode of the PD 22 is connected to the gate electrode of the Ta 24. The charge (e.g. electrons) stored in the FD is applied as a voltage signal to the gate electrode of the Ta 24.

In the Tr 23, a source electrode is connected to the FD 26, and a supply voltage VDD (not shown) is applied to the drain electrode. The gate electrode of the Tr 23 is connected to a reset line 27. The Tr 23 is turned on in response to the application of a reset pulse from the vertical scanning circuit 13 to the gate electrode of the Tr 23 through the reset line 27. In response to turning on the Tr 23, the supply voltage VDD is applied to the FD 26 and thereby the charge stored in the FD 26 is discharged (discarded).

A gate electrode of the Ta 24 is connected to the FD 26. The supply voltage VDD is applied to a drain electrode of the Ta 24. A source electrode, to which a pixel signal (signal voltage) is outputted, of the Ta 24 is connected to a drain electrode of the Ts 25. In response to turning on the Ta 24, the pixel signal, which corresponds to the amount of the charge stored in the FD 24, is outputted to the source electrode.

The drain electrode of the Ts 25 is connected to the source electrode of the Ta 24. A source electrode of the Ts 25 is connected to a signal line 28. A gate electrode of the Ts 25 is connected to a row selection line 29. Upon input of a select pulse from the vertical scanning circuit 13 through the row selection line 29, the Ts 25 is turned on and outputs the pixel signal, which is outputted from the Ta 24, to the signal line 28.

The vertical scanning circuit 13 drives the pixels 21. The reset line 27 and the row selection line 29 of each row are connected to the vertical scanning circuit 13. The vertical scanning circuit 13 inputs a reset pulse to the reset line 27 of a selected row. The vertical scanning circuit 13 inputs the select pulse to the row selection line 29. Thus, the vertical scanning circuit 13 controls the operations of the Tr 23 and Ts 25.

The horizontal scanning circuit 14 turns on one of column selection transistors (Tcs) 32 provided to each signal line 28. Thereby, the horizontal scanning circuit 14 selects a column from which the pixel signals are read out.

The signal line 28 is used for reading out the pixel signal from each pixel 21. The signal line 28 is provided to each column of the pixels 21. A correlated double sampling (CDS) circuit 31 and the column selection transistor 32 are provided at an end of the signal line 28. The CDS circuit 31 operates based on a clock signal inputted from the control circuit 17. The CDS circuit 31 performs sample-and-hold operation of the pixel signal so as to remove noise associated with reading from the pixel 21 on the row selection line 29 selected by the vertical scanning circuit 13. Upon turning on the column selection transistor 32 by the horizontal scanning circuit 14, the pixel signal held by the CDS circuit 31 is outputted to the output circuit 16 through an output bus line 33.

The output circuit 16 comprises an amplifier 34 and an A/D conversion circuit 35. The amplifier 34 amplifies the pixel signal inputted from the CDS circuit 31. The A/D conversion circuit 35 converts the pixel signal, which has been amplified by the amplifier 34, into digital data. A gain of the amplifier 34 is adjustable and adjusted as necessary according to settings such as an imaging mode.

The control circuit 17 centrally controls operation of each section of the solid-state imaging device 10. For example, the vertical scanning circuit 13 and the horizontal scanning circuit 14 operate based on control signals (e.g. the clock signals) inputted from the control circuit 17. The control circuit 17 also controls the operation of the CDS circuit 31, the gain of the amplifier 34, and the like.

As illustrated in FIG. 2, the color filters 41 have a long periodicity in units of color arrays of 6×6 pixels. To be more specific, the color filters 41 are composed of two types of subunits (first and second subunits) 41a and 41b each having a color array of 3×3 pixels. The two first subunits 41a are arranged diagonally and the two second subunits 41b are arranged diagonally. In the first subunit 41a, the green (G) filters are disposed at the center and the diagonal positions (corners) of the 3×3 pixels. The blue (B) filter is disposed in the middle of each of the left and right columns of the 3×3 pixels. The red (R) filter is disposed in the middle of each of the top and bottom rows of the 3×3 pixels. The second subunit 41b is the same as the first subunit 41a in that the G filters are disposed at the center and the diagonal positions (corners) of the 3×3 pixels. However, the arrangement of the B and R filters in the second subunit 41b is opposite to that in the first subunit 41a. In the second subunit 41b, the R filter is disposed in the middle of each of the left and right columns of the 3×3 pixels. The B filter is disposed in the middle of each of the top and bottom rows of the 3×3 pixels.

For example, as compared with a Bayer array in units of the color arrays of 2×2 pixels, the color filters 41 have a long periodicity, so that the solid-state imaging device 10 prevents occurrence of moiré without using an optical low-pass filter. In the solid-state imaging device 10 with the color filters 41, the RGB pixels are present in each of the X and Y directions. As a result, false color is reduced or prevented and the colors are reproduced exactly.

Most of the pixels in the light receiving area 11 of the solid-state imaging device 10 are the normal pixels 43. The normal pixel 43 evenly or isotropically receives the light incident from the Y direction and the light incident from the X direction. The hybrid pixels 42a and 42b serve both as the normal pixels and as the phase detection pixels. For example, hybrid pixels 42a and 42b are the G pixels disposed at the lower left corners of the upper right first subunit 41a and the upper left second subunit 41b, respectively.

In the case where the hybrid pixels 42a and 42b function as the phase detection pixels, focus evaluation is performed based on the pixel signals (the pixel values) obtained from the hybrid pixels 42a and 42b, which constitute a pair. Based on the result of the focus evaluation, the position of the taking lens is adjusted automatically. In the case where the hybrid pixels 42a and 42b are used as the normal pixels, the pixel signals of the hybrid pixels 42a and 42b are used for producing a normal image, without gain correction or interpolation, as in the case of the pixel values of other normal pixels 43.

The pairs of the hybrid pixels 42a and 42b are uniformly distributed all over the light receiving area 11. The hybrid pixel 42a or 42b may not necessarily be provided in each unit of 6×6 pixels (of the color filters 41). There may be a unit with no hybrid pixel 42a or 42b. In the unit with no hybrid pixel 42a or 42b, all the pixels are the normal pixels 43. Note that, in the unit provided with the hybrid pixel 42a or 42b, the hybrid pixel 42a or 42b is disposed at a position illustrated in FIG. 2.

Figure 3:
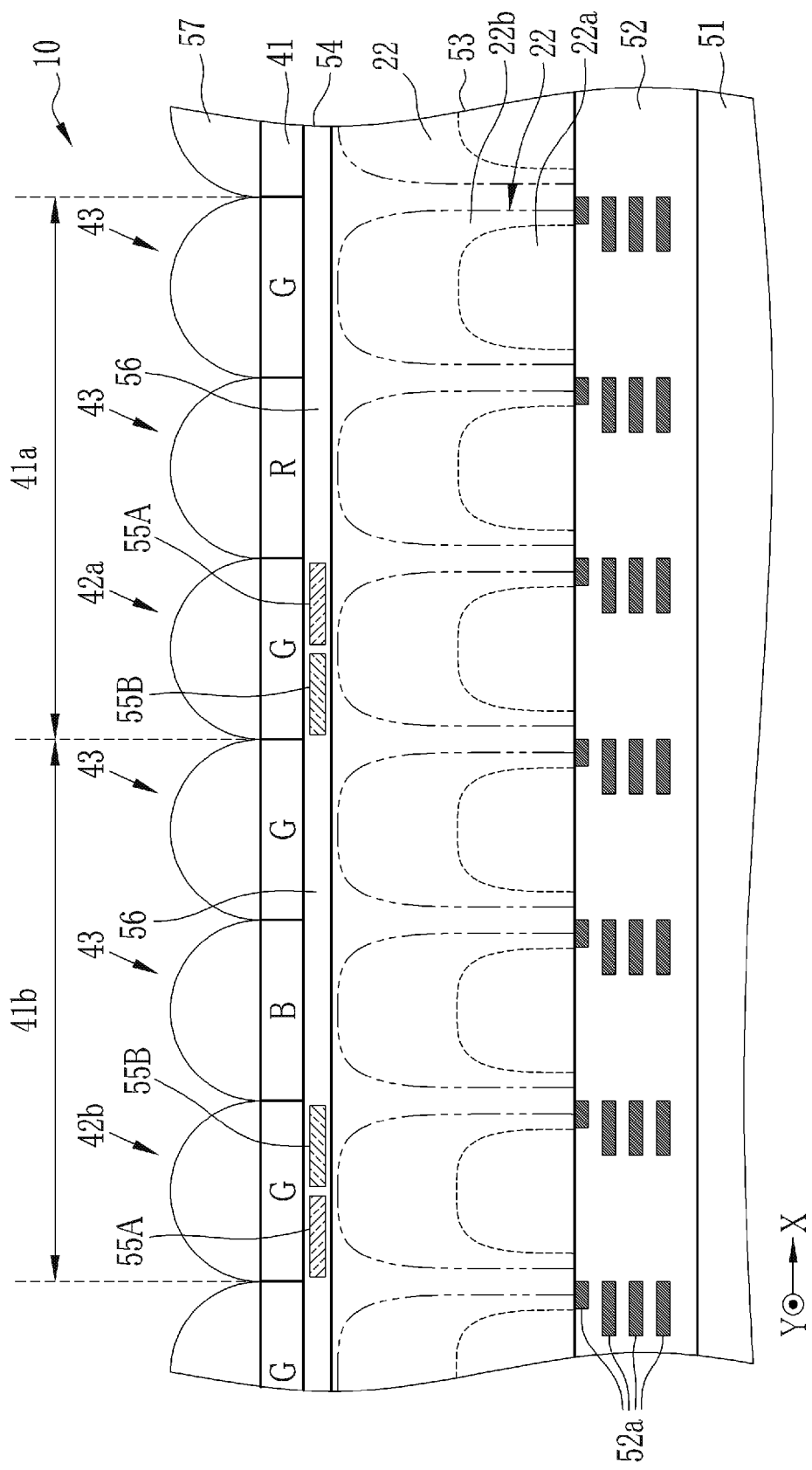
FIG. 3 is partial cross-sectional view of the solid-state imaging device.

As illustrated in FIG. 3, the solid-state imaging device 10 is a BSI (back-side illuminated) type CMOS image sensor. The solid-state imaging device 10 is composed of a support plate 51, a wiring layer 52, a p-type semiconductor substrate 53, a transparent electrode layer 54, the color filters 41, microlenses 57, and the like. The "surface" of the solid-state imaging device 10 refers to the side on which the wiring layer 52 is provided over the p-type semiconductor substrate 53. The "back side (underside)" of the solid-state imaging device 10 refers to the side on which the color filters 41, the transparent electrode layer 54, and the microlenses 57 are provided. In the solid-state imaging device 10, the light is incident on the PD 22 from the back side through the microlens 57, the color filter 41, and the transparent electrode layer 54.

The support plate 51 is a silicon plate, for example. The support plate 51 is bonded to the surface of the wiring layer 52 in a manufacturing process of the BSI type solid-state imaging device 10 so as to expose the back surface of the p-type semiconductor substrate 53 and reduce the thickness of the p-type semiconductor substrate 53.

The wiring layer 52 is formed over the surface of the p-type semiconductor substrate 53. Wiring 52a provided in the wiring layer 52 constitutes the transistors (Tr 23, Ta 24, and Ts 25) of each of the pixels 21 (the normal pixels 43 and the hybrid pixels 42a and 42b), various circuits (the vertical scanning circuit 13, the horizontal scanning circuit 14, the output circuit 16, the control circuit 17, the CDS circuit 31, and the like), and various types of wiring (the reset line 27, the signal line 28, the row selection line 29, the output bus line 33, and the like) for driving each pixel 21. Note that the wiring layer 52 is provided with wiring (not shown) to discharge an unnecessary charge generated in each PD 22 due to dark current or the like.

The PD 22 is formed by p-n junction of the p-type semiconductor substrate 53 and an n-type semiconductor region 22a formed in the p-type semiconductor substrate 53.

The p-type semiconductor substrate 53 is thin. A photoelectric conversion region 22b, indicated by a chain double-dashed line, extends close to the back side of the p-type semiconductor substrate 53. The photoelectric conversion region 22b refers to the whole region capable of generating a charge upon incidence of light. The charge (electrons) generated by the PD 22 is stored in the n-type semiconductor region (hereinafter referred to as the charge storage region 22a) with a low potential. Note that the PD 22 refers to the entire, which is formed by the p-n junction, of the photoelectric conversion region 22b and the charge storage region 22a. Each PD 22 is isolated by an isolation layer (e.g. a p+ layer) (not shown), so that the charge transfer does not occur between the adjacent PDs 22. Note that the charge storage region 22a is connected to the FD 26.

The transparent electrode layer 54 is provided on the back side of the p-type semiconductor substrate 53. The transparent electrode layer 54 is composed of the transparent electrodes 55A and 55B and an insulating film 56. The transparent electrodes 55A and 55B are made from a transparent conductive material, for example, polysilicon (Poly-Si) or the like. Upon application of a voltage, the transparent electrodes 55A and 55B modulate a potential of the charge storage region 22a. The transparent electrodes 55A and 55B correspond to a potential modulation electrode. The voltage (a negative voltage in the case of storing the electrons) applied to the transparent electrode 55A or 55B increases the potential, with respect to the charge (electrons) generated and stored, of the charge storage region 22a located immediately below the transparent electrode 55A or 55B. This potential modulation does not change the n-type semiconductor region itself, but changes the width (that is, the size in the XY plane) of the effective charge storage region 22a.

In a case where the PD 22 is divided into two portions (a left portion, which is located upstream in the X direction, and a right portion), the transparent electrodes 55A and 55B cover the left and right portions of the PD 22. In each of the hybrid pixel 42a and the hybrid pixel 42b, which constitute a pair, the transparent electrodes 55A and 55B are disposed symmetrically with respect to the left-right direction. To be more specific, in the hybrid pixel 42a, the transparent electrode 55A is disposed to the right portion of the PD 22 and the transparent electrode 55B is disposed to the left portion of the PD 22. In the hybrid pixel 42b, the transparent electrode 55A is disposed to the left portion of the PD 22 and the transparent electrode 55B is disposed to the right portion of the PD 22.

The insulating film 56 insulates between the p-type semiconductor substrate 53 and the transparent electrodes 55A and 55B. The insulating film 56 also serves as a planarizing film for planarizing the plane over the transparent electrodes 55A and 55B. The transparent electrode layer 54 located in the normal pixels 43 is formed only of the insulating film 56. The insulating film 56 is formed from a transparent non-conductive material, for example, BPSG or the like. Note that the insulating film 56 is a combination of an insulating film disposed below the transparent electrodes 55A and 55B, an insulating film disposed between the transparent electrodes 55A and 55B, and the planarizing film disposed over the transparent electrodes 55A and 55B.

The color filters 41 are disposed over the transparent electrode layer 54 such that their colors (color segments) correspond to the respective PDs 22. The color filter 41 selectively transmits R, G, or B color light.

The microlenses 57 are disposed over the color filters 41 such that the microlenses 57 correspond to the respective PDs 22. The microlens 57 has an approximately hemispherical shape. The microlens 57 collects the incident light in the corresponding PD 22. Note that the center of the microlens 57 substantially coincides with the center of the PD 22 at the center of the light receiving area 11. However, the center of the microlens 57 is shifted (off-centered) toward the center of the light receiving area 11 in accordance with a principal ray angle as the microlens 57 is located closer to the periphery of the light receiving area 11. This is referred to as "scaling". Thereby, the light incident on the PD 22 from an oblique direction is efficiently collected in the corresponding PD 22 in a peripheral portion of the light receiving area 11.

Figure 4:
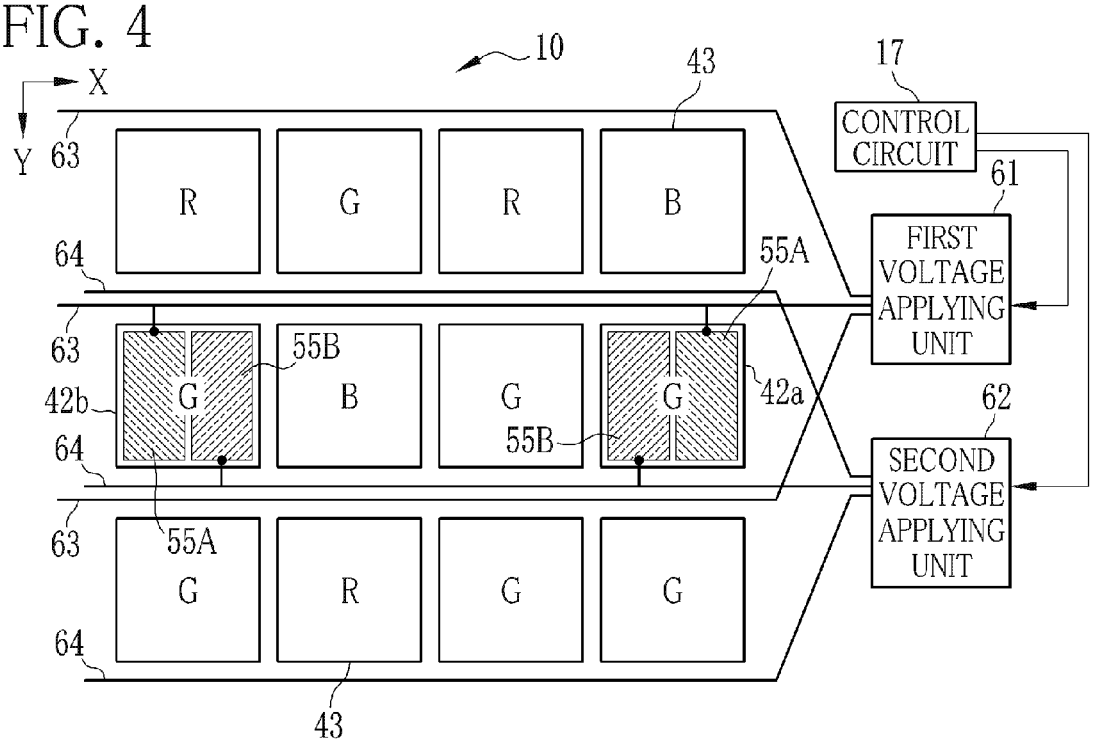
FIG. 4 is an explanatory view illustrating transparent electrodes of hybrid pixels.

As illustrated in FIG. 4, the solid-state imaging device 10 has a first voltage applying unit 61, a second voltage applying unit 62, wiring 63, and wiring 64. The wirings 63 and 64 connect the first and second voltage applying units 61 and 62 to the transparent electrodes 55A and 55B, respectively. Thus, the voltages applied to the transparent electrodes 55A and 55B are controlled independently from each other.

The first voltage applying unit 61 applies a voltage to the transparent electrode 55A through the wiring 63. Based on a control signal inputted from the control circuit 17, the first voltage applying unit 61 adjusts timing and magnitude of the voltage applied to the transparent electrode 55A. For example, the first voltage applying unit 61 applies a positive voltage to the transparent electrode 55A in performing the phase detection AF. In imaging a subject after the phase detection AF, the first voltage applying unit 61 brings the voltage applied to the transparent electrode 55A to zero (or causing the voltage of the transparent electrode 55A to fall to ground or the like so as not to apply a voltage).

The second voltage applying unit 62 applies a voltage to the transparent electrode 55B through the wiring 64. Based on a control signal inputted from the control circuit 17, the second voltage applying unit 62 adjusts timing and magnitude of the voltage applied to the transparent electrode 55B, in a manner similar to the first voltage applying unit 61. In the case of the phase detection AF, the sign of the voltage applied from the second voltage applying unit 62 to the transparent electrode 55B is opposite to the sign of the voltage applied from first voltage applying unit 61 to the transparent electrode 55A. To be more specific, in the case of the phase detection AF, the second voltage applying unit 62 applies a negative voltage to the transparent electrode 55B. In imaging the subject after the phase detection AF, the second voltage applying unit 62 brings the voltage applied to the transparent electrode 55B to zero, in a manner similar to the first voltage applying unit 61.

Note that each of the first voltage applying unit 61 and the second voltage applying unit 62 is formed from the wiring 52a and the like of the wiring layer 52, in a manner similar to the control circuit 17. The wiring 63, which connects the first voltage applying unit 61 and the transparent electrode 55A, and the wiring 64, which connects the second voltage applying unit 62 and the transparent electrode 55B, are formed from polysilicon in the transparent electrode layer 54, in a manner similar to the transparent electrodes 55A and 55B, for example. The first and second voltage applying units 61 and 62 are connected to the wirings 63 and 64, respectively, through via holes (or through holes, not shown), which penetrate the p-type semiconductor substrate 53.

As illustrated in a part (A) of FIG. 5, in the case where a voltage is not applied to the transparent electrodes 55A and 55B of the hybrid pixels 42a and 42b (that is, in the case of zero voltage), the potential of the charge storage region 22a does not change, so that the charge storage region 22a of the hybrid pixel 42a, the charge storage region 22a of the hybrid pixel 42b, and the charge storage region 22a of the normal pixel 43 are identical in size. Since the transparent electrodes 55A and 55B and the insulating film 56 over the normal pixel 43 are transparent, they do not interfere with the incident light reaching the PD 22. Therefore the hybrid pixels 42a and 42b and the normal pixel 43 function practically the same in the case where a voltage is not applied to the transparent electrodes 55A and 55B. In other words, the hybrid pixels 42a and 42b function as the normal pixels 43. For example, in each of the normal pixel 43 and the hybrid pixels 42a and 42b, both of a charge 70a generated in the right portion of the PD 22 and a charge 70b generated in the left portion of the PD 22 are stored in the n-type semiconductor region (charge storage region) 22a.

As illustrated in a part (B) of FIG. 5, in a case where a positive voltage is applied to the transparent electrode 55A, and a negative voltage is applied to the transparent electrode 55B, the potential, with respect to the charge (electrons), immediately below the transparent electrode 55B increases. Thereby the charge storage region 22a narrows in the X direction. For this reason, in the hybrid pixel 42a, the potential of the left portion of the original charge storage region 22a increases, so that an effective charge storage region 73a is locally formed (distributed) only in the right portion of the charge storage region 22a. The effective charge storage region 73b of the hybrid pixel 42b is locally formed (distributed) only in the left portion of the charge storage region 22a.

Since the transparent electrodes 55A and 55B are transparent, the region on which the incident light is incident does not change and neither the size nor the shape of the photoelectric conversion region 22b is changed. Therefore in each of the hybrid pixels 42a and 42b, the charges 70a and 70b are generated irrespective of the right portion or the left portion of the PD 22. In the hybrid pixels 42a and 42b, however, the effective charge storage regions 73a and 73b are locally formed (distributed) in the right and left portions, respectively, so that only one of the charges 70a and 70b generated is stored in the charge storage region 73a or 73b.

In other words, in the hybrid pixel 42a, the effective charge storage region 73a is formed only in the right portion, so that the charge 70a generated in the right portion of the PD 22 is stored in the effective charge storage region 73a. However, the charge 70b generated in the left portion of the PD 22 is discharged through wiring for removing a dark current or the like. In the hybrid pixel 42b, the effective charge storage region 73b is formed only in the left portion, so that the charge 70a generated in the right portion of the PD 22 is not stored and only the charge 70b generated in the left portion of the PD 22 is stored in the effective charge storage region 73b. As described above, in the case where a negative voltage is applied to the transparent electrode 55B, the light receiving area of each of the hybrid pixels 42a and 42b is isotropic, but only the charge generated in the right portion or the left portion is selectively stored. Thus, the hybrid pixels 42a and 42b function as the so-called phase detection pixels.

In the case where the voltages applied to the transparent electrodes 55A and 55B are brought back to the zero voltage, the charge storage regions 73a and 73b, which have been narrowed, are restored to the original charge storage regions 22a. Thereby the hybrid pixels 42a and 42b function as the normal pixels 43.

As described above, the solid-state imaging device 10 adjusts the voltages applied to the transparent electrodes 55A and 55B of the hybrid pixels 42a and 42b to control the charge storage regions 22a of the hybrid pixels 42a and 42b. Thereby, the solid-state imaging device 10 performs the phase detection AF. In the case of the phase detection AF, the hybrid pixels 42a and 42b function as the phase detection pixels. In the case of imaging a subject after the phase detection AF, the hybrid pixels 42a and 42b function as the normal pixels.

As described above, in addition to serving as the phase detection pixels, the hybrid pixels 42a and 42b serve as the normal pixels, so that the pixel signals from the hybrid pixels 42a and 42b are used for producing a normal image of a subject, without additional processing, in imaging a subject. It is not necessary to correct the pixel signals from the hybrid pixels 42a and 42b through the interpolation process, the gain adjustment, and the like as it was in a solid-state imaging device having conventional phase detection pixels. As a result, the sensitivity and the resolution of a normal image are not reduced at the portions of the normal image corresponding to the positions of the hybrid pixels 42a and 42b. There is no limitation imposed by the hybrid pixels 42a and 42b on the drive modes, allowing taking movies and adding pixels which the solid-state imaging device having the conventional phase detection pixels could not perform.

In the first embodiment, the transparent electrodes 55A and 55B divide each of the hybrid pixels 42a and 42b into two sections in the left-right direction. At the time of the phase detection AF, the information related to the parallax in the left-right direction is obtained from the hybrid pixels 42a and 42b. The direction of the arrangement of the transparent electrodes 55A and 55B may be changed as necessary. For example, the transparent electrodes 55A and 55B may be arranged in the up-down direction to obtain the information related to the parallax in the up-down direction from the hybrid pixels 42a and 42b. The transparent electrodes 55A and 55B may be arranged obliquely in the oblique 45-degree (or 135-degree) direction to obtain the information related to the parallax in the oblique direction from the hybrid pixels 42a and 42b.

A positive voltage is applied to the transparent electrode 55A. A negative voltage is applied to the transparent electrode 55B. Thereby the hybrid pixel 42a functions as a phase detection pixel which selectively stores the charge generated by the light incident on the right portion of the hybrid pixel 42a. The hybrid pixel 42b functions as a phase detection pixel which selectively stores the charge generated by the light incident on the left portion of the hybrid pixel 42b. The signs of the voltages applied to the transparent electrodes 55A and 55B may be reversed. In this case, the right portion of the charge storage region 22a is narrowed (ineffective) in the hybrid pixel 42a, so that the effective charge storage region is locally formed only in the left portion of the charge storage region 22a. In the hybrid pixel 42b, the left portion of the charge storage region 22a is narrowed (ineffective), so that the effective charge storage region is locally formed only in the right portion of the charge storage region 22a.

In the case where a negative voltage is applied to the transparent electrode 55B, the hybrid pixels 42a and 42b function as the phase detection pixels as described above even if a voltage is not applied to the transparent electrode 55A (e.g. the transparent electrode 55A is set to ground).

In the unit of 6×6 pixels, the G pixel at the lower left corner of the upper right first subunit 41a is the hybrid pixel 42a and the G pixel at the lower left corner of the upper left second subunit 41b is the hybrid pixel 42b, by way of example. The positions of the G pixels in the hybrid pixels 42a and 42b are arbitrary. For example, the G pixel at the center of the upper right first subunit 41a may be the hybrid pixel 42a. The G pixel at the center of the upper left second subunit 41b may be the hybrid pixel 42b.

Second Embodiment

Figure 6:
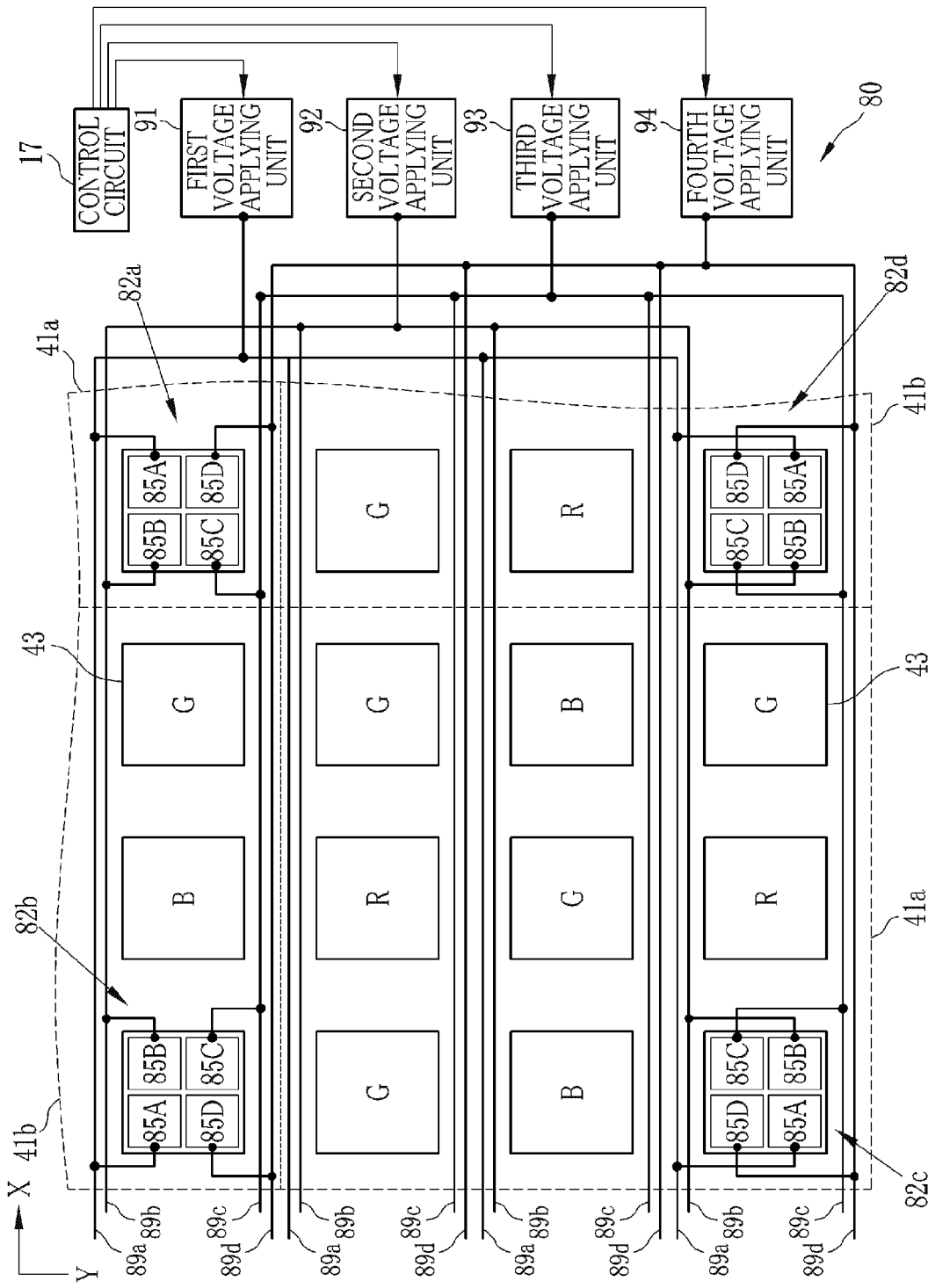
FIG. 6 is an explanatory view illustrating a solid-state imaging device using four transparent electrodes.

In the first embodiment, each of the hybrid pixels 42a and 42b has the transparent electrodes 55A and 55B. Each of the hybrid pixels 42a and 42b may have more transparent electrodes. For example, as illustrated in FIG. 6, a solid-state imaging device 80 has four transparent electrodes in each hybrid pixel. The voltages applied to the four respective electrodes 85 are controlled independently.

The solid-state imaging device 80 comprises four hybrid pixels 82a, 82b, 82c, and 82d in each unit of 6×6 pixels with the color filters 41.

The hybrid pixel 82a is the G pixel located at the lower left corner of the upper right first subunit 41a. The four transparent electrodes 85A, 85B, 85C, and 85D control the potential of the PD 22, which is located immediately below them. For example, the hybrid pixel 82a has the transparent electrodes 85A, 85B, 85C, and 85D provided at the upper right, the upper left, the lower left, and the lower right, respectively, of the hybrid pixel 82a.

The hybrid pixel 82b is the G pixel located at the lower left corner of the upper left second subunit 41b. The potential of the charge storage region 22a is controlled by the four transparent electrodes 85A, 85B, 85C, and 85D, in a manner similar to that of the hybrid pixel 82a. However, the arrangement of the transparent electrodes 85A to 85D in the hybrid pixel 82b differs from that in the hybrid pixel 82a. The arrangement of the transparent electrodes 85A to 85D in the hybrid pixel 82b and the arrangement of the transparent electrodes 85A to 85D in the hybrid pixel 82a are symmetric with respect to the left-right direction. In other words, the positions of the transparent electrodes 85A to 85D are interchanged in the X direction. In the hybrid pixel 82b, the transparent electrode 85A is located at the upper left. The transparent electrode 85B is located at the upper right. The transparent electrode 85C is located at the lower right. The transparent electrode 85D is located at the lower left.

The hybrid pixel 82c is the G pixel located at the lower left corner of the lower left first subunit 41a. The hybrid pixel 82d is the G pixel located at the lower left corner of the lower right second subunit 41b. In each of the hybrid pixels 82c and 82d, the potential of the PD 22 located immediately below the four transparent electrodes 85A to 85D is controlled by the transparent electrodes 85A to 85D, in a manner similar to those of the hybrid pixels 82a and 82b. However, the arrangements of the transparent electrodes 85A to 85D in the hybrid pixels 82c and 82d differ from those in the hybrid pixels 82a and 82b.

The transparent electrodes 85A of 85D of the hybrid pixel 82c are provided to the lower left, the lower right, the upper right, and the upper left, respectively. In other words, the arrangement of the transparent electrodes 85A to 85D in the hybrid pixel 82c and the arrangement of the transparent electrodes 85A to 85D in the hybrid pixel 82b, which is located above the hybrid pixel 82c in the same column, are symmetric with respect to the up-down direction. In other words, the positions of the transparent electrodes are interchanged in the Y direction. The arrangement of the transparent electrodes 85A to 85D in the hybrid pixel 82a and the arrangement of the transparent electrodes 85A to 85D in the hybrid pixel 82c are symmetric with respect to the oblique direction (approximately 135-degree direction).

In the hybrid pixel 82d, the transparent electrodes 85A to 85D are arranged in the lower right, the lower left, the upper left, and the upper right, respectively. The arrangement of the transparent electrodes 85A to 85D in the hybrid pixel 82d and the arrangement of the transparent electrodes 85A to 85D in the hybrid pixel 82a, which is located above the hybrid pixel 82d in the same column, are symmetric with respect to the up-down direction. The arrangement of the transparent electrodes 85A to 85D in the hybrid pixel 82b and the arrangement of the transparent electrodes 85A to 85D in the hybrid pixel 82d are symmetric with respect to the oblique direction. In other words, the positions of the lower right and upper left transparent electrodes are interchanged.

Each of the hybrid pixels 82a to 82d is connected to a first voltage applying unit 91, a second voltage applying unit 92, a third voltage applying unit 93, and a fourth voltage applying unit 94 through wirings 89a, 89b, 89c, and 89d. The wirings 89a to 89d is made from polysilicon or the like in a manner similar to the first embodiment and provided in the transparent electrode layer 54. The first to fourth voltage applying units 91 to 94 apply voltages to the transparent electrodes 85A to 85D through the wirings 89a to 89d, respectively and independently. The first to fourth voltage applying units 91 to 94 are formed from the wiring 52a and the like of the wiring layer 52 in a manner similar to the first embodiment, and connected to the wirings 89a to 89d through via holes. Based on control signals inputted from the control circuit 17, the first to fourth voltage applying units 91 to 94 adjust timing and magnitude of the voltage applied to the transparent electrodes 85A to 85D, respectively.

Figure 7:
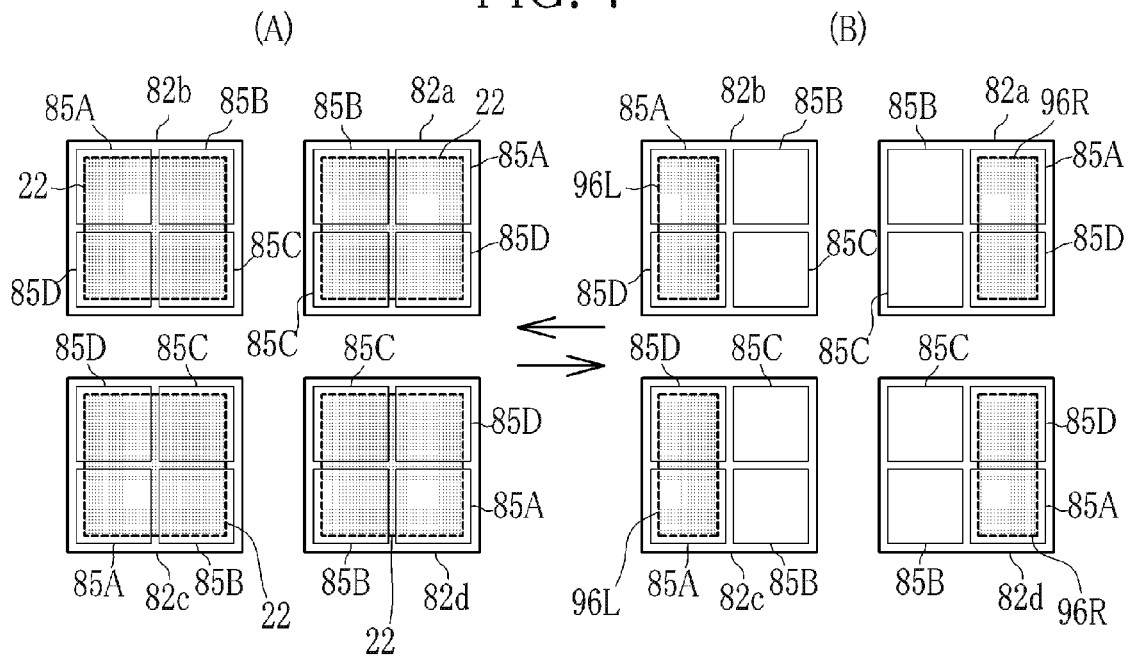
FIG. 7 is an explanatory view illustrating an example in which parallax in a left-right direction is obtained.

In the solid-state imaging device 80 thus configured, as illustrated in a part (A) of FIG. 7, the hybrid pixels 82a to 82d function as the normal pixels 43 in a case where no voltage is applied to the transparent electrodes 85A to 85D. The charge storage region 22a of each of the hybrid pixels 82a to 82d is the same as that of the normal pixel 43. In the case where a subject is imaged with no voltage applied to the transparent electrodes 85A to 85D, the pixel signals obtained from the hybrid pixels 82a to 82d are used for producing a normal image, without gain correction or the like. Thus, the hybrid pixels 82a to 82d also serve as the normal pixels.

In a case where a positive voltage is applied to each of the transparent electrodes 85A and the transparent electrodes 85D, and a negative voltage is applied to each of the transparent electrodes 85B and the transparent electrodes 85C, the charge storage region 22a of each of the hybrid pixels 82a to 82d is narrowed. The effective charge storage region 96R or 96L remains only immediately below the transparent electrodes 85A and the transparent electrodes 85D. In other words, in each of the hybrid pixels 82a and 82d located on the right side in the unit of 6×6 pixels, the effective charge storage region 96R is locally formed (distributed) only in the right portion of the charge storage region 22a. Thereby each of the hybrid pixels 82a and 82d functions as the phase detection pixel which selectively receives the light beams incident on the right portion thereof. In each of the hybrid pixels 82b and 82c located on the left side, the effective charge storage region 96L is locally formed (distributed) only in the left portion of the charge storage region 22a. Thereby each of the hybrid pixels 82b and 82c functions as the phase detection pixel which selectively receive the light beams incident on the left portion thereof.

The phase detection AF based on the left-right parallax is performed by applying a positive voltage to each of the transparent electrodes 85A and 85D and a negative voltage to each of the transparent electrodes 85B and 85C. Note that the focus is evaluated in a well-known manner, for example, based on the pixel signals obtained from the pair of the hybrid pixels 82a and 82b or the pair of the hybrid pixels 82d and 82c.

Figure 8:
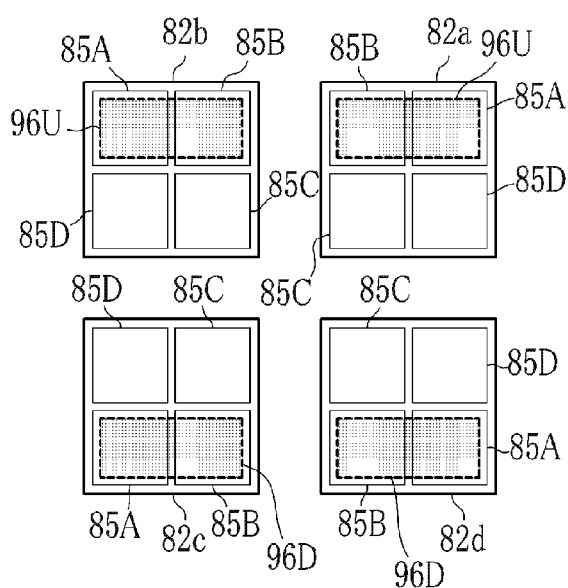
FIG. 8 is an explanatory view illustrating an example in which parallax in an up-down direction is obtained.

As illustrated in FIG. 8, the charge storage region 22a of each of the hybrid pixels 82a to 82d is narrowed in the case where a positive voltage is applied to each of the transparent electrodes 85A and 85B and a negative voltage is applied to each of the transparent electrodes 85C and 85D. Thereby the effective charge storage region 96U or 96D remains only immediately below the transparent electrodes 85A and 85B. In other words, in each of the hybrid pixels 82a and 82b located in an upper portion (upstream side in the Y direction) in the unit of 6×6 pixels, the effective charge storage region 96U is locally formed (distributed) only in the upper portion of the charge storage region 22a. Thereby each of the hybrid pixels 82a and 82b functions as the phase detection pixel which selectively receives the light beams incident on the upper portion thereof. In each of the hybrid pixels 82c and 82d located in a lower portion (downstream side in the Y direction) in the unit of 6×6 pixels, the effective charge storage region 96D is locally formed (distributed) only in the lower portion of the charge storage region 22a. Thereby each of the hybrid pixels 82c and 82d functions as the phase detection pixel which selectively receives the light beams incident on the lower portion thereof.

By applying a positive voltage to the transparent electrodes 85A and 85B and applying a negative voltage to the transparent electrodes 85C and 85D, the solid-state imaging device 80 performs the phase detection AF based on the up-down parallax. The phase detection AF based on the up-down parallax is suitable for imaging a subject which has a change in the up-down direction and little change in the left-right direction, for example, a horizon or the like. By changing a pattern of applying voltages to the transparent electrodes 85A to 85D depending on a subject, the phase detection AF with higher accuracy is selected from the phase detection AF which is based on the left-right parallax and the phase detection AF which is based on the up-down parallax.

Note that, in a conventional solid-state imaging device, which makes the phase detection pixels asymmetric with light-shielding films or the like, the phase detection pixels for detecting the parallax in the left-right direction and the phase detection pixels for detecting the parallax in the up-down direction are arranged in advance so as to obtain the information related to the parallax both in the left-right direction and the up-down direction. As compared with the case where the information related to the parallax in one of the left-right direction or the up-down direction is obtained, twice the number of the phase detection pixels is necessary. This means that the number of pixel signals which are subjected to the gain correction or the interpolation is doubled. As a result, degradation in sensitivity and resolution is significant. As compared with the conventional solid-state imaging device, the solid-state imaging device 80 of the present invention allows switching between the information related to the parallax in the left-right direction and the information related to the parallax in the up-down direction as necessary. Furthermore, the hybrid pixels 82a to 82d function as the normal pixels in imaging the normal images. Thus, the solid-state imaging device 80 of the present invention takes the normal images with minimal degradation in sensitivity and resolution.

Figure 9:
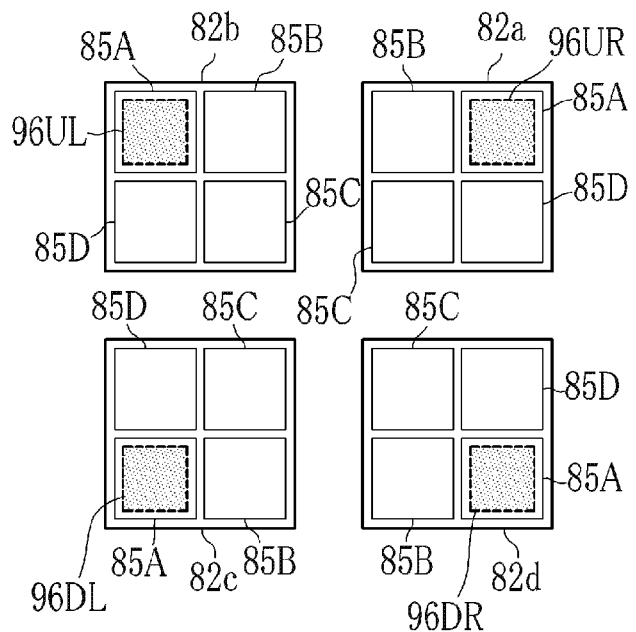
FIG. 9 is an explanatory view illustrating an example in which parallax in an oblique direction is obtained.

As illustrated in FIG. 9, in the solid-state imaging device 80, a positive voltage is applied to the transparent electrode 85A and a negative voltage is applied to each of the transparent electrodes 85B to 85D. Thereby the charge storage regions 22a of the hybrid pixels 82a to 82d are narrowed, so that only the effective charge storage regions 96UR, 96UL, 96DL, and 96DR remain below the transparent electrodes 85A, respectively. In this case, the hybrid pixels 82a to 82d function as the phase detection pixels, which selectively receive the light incident from the upper right, the upper left, the lower left, and the lower right directions, respectively. For example, the phase detection AF is performed based on the signals obtained from the pair of the hybrid pixel 82a and the hybrid pixel 82c or the signals obtained from the pair of the hybrid pixel 82b and the hybrid pixel 82d. Thereby the phase detection AF is performed based on the parallax in the oblique direction.

Figure 10:
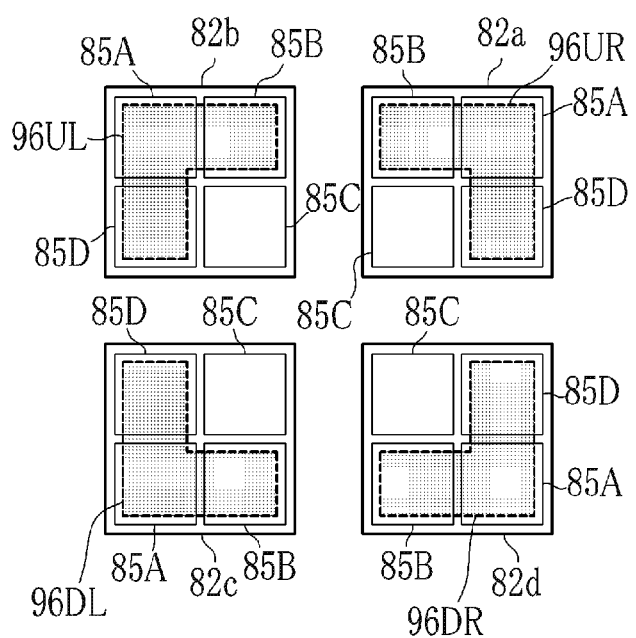
FIG. 10 is an explanatory view illustrating another example in which the parallax in the oblique direction is obtained.

As illustrated in FIG. 10, positive voltages are applied to the transparent electrodes 85A, 85B, and 85D, while a negative voltage is applied to the transparent electrodes 85C, by way of example. In this case, the effective charge storage regions of the hybrid pixels 82a to 82d are L-shaped charge storage regions 96UR, 96UL, 96DL, and 96DR, respectively. The phase detection AF is performed based on the signals obtained from the pair of the hybrid pixel 82a and the hybrid pixel 82c or the pair of the hybrid pixel 82b and the hybrid pixel 82d. Thereby the phase detection AF is performed based on the parallax in the oblique direction. The phase detection AF is performed in a like manner in a case where a positive voltage is applied to the transparent electrodes 85A, a negative voltage is applied to the transparent electrodes 85C, and no voltage is applied to the transparent electrodes 85B and 85D, for example.

Figure 11:
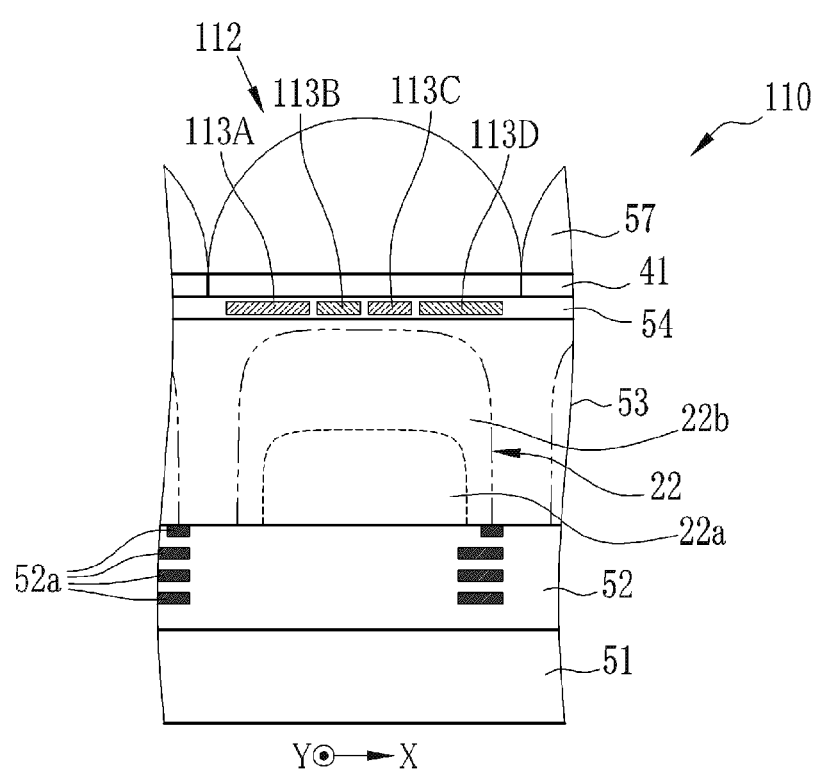
FIG. 11 is a cross-sectional view of a hybrid pixel having four transparent electrodes.

Note that in the second embodiment, the plurality of transparent electrodes are arranged two-dimensionally byway of example. The transparent electrodes may be arranged one-dimensionally. For example, in a solid-state imaging device 110 illustrated in FIG. 11, a hybrid pixel 112, in which four transparent electrodes 113A to 113D are arranged in a lateral direction (X direction), is used to accurately control the size and the position of the charge storage region 22a. The solid-state imaging device 110 may be used in combination with various types of taking lenses. A zooming lens (not shown), which is capable of changing the focal length, is particularly suitable.

Figure 12:
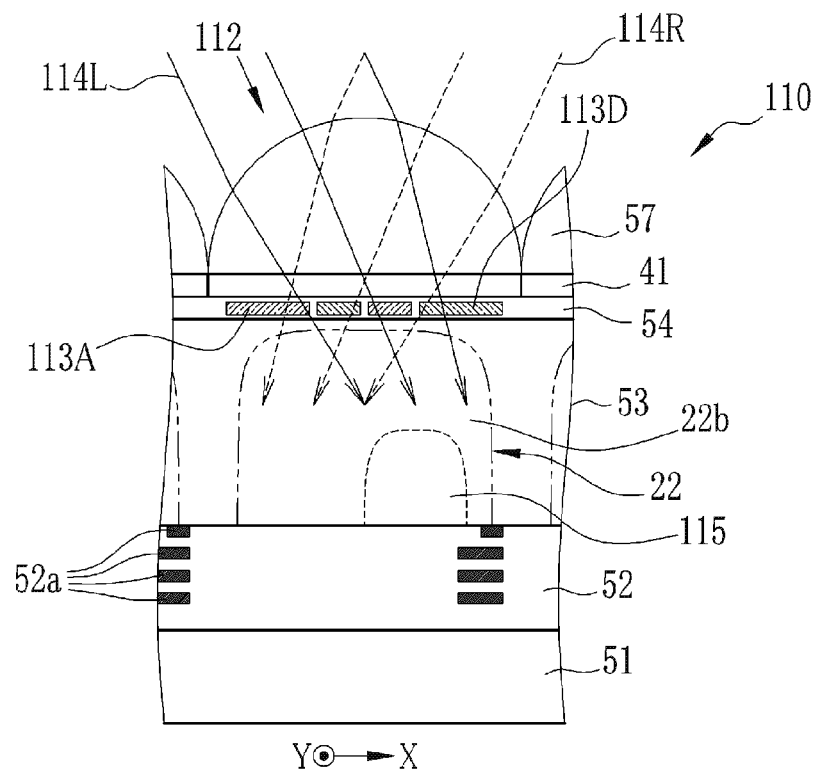
FIG. 12 is a cross-sectional view illustrating a charge storage region and incident light at a wide-angle end position in a case where a zooming lens is used.

As illustrated in FIG. 12, in a case where the zooming lens is at the wide-angle end (the shortest focal length), the light (hereinafter referred to as the right light beams) 114R, which is incident mostly from a right side, is incident on the left portion of the photoelectric conversion region 22b. The light (hereinafter referred to as the left light beams) 114L, which is incident mostly from a left side, is incident on the right portion of the photoelectric conversion region 22b. In a case where a negative voltage is applied to each of the transparent electrode 113A and the transparent electrode 113B, which are located on the left side, and a positive voltage is applied to each of the transparent electrode 113C and the transparent electrode 113D, which are located on the right side, an effective charge storage region 115 is locally formed (distributed) only in the right portion of the PD 22. Thereby the charge generated by the left light beams 114L is stored, while the charge generated by the right light beams 114R is discharged (discarded).

Figure 13:
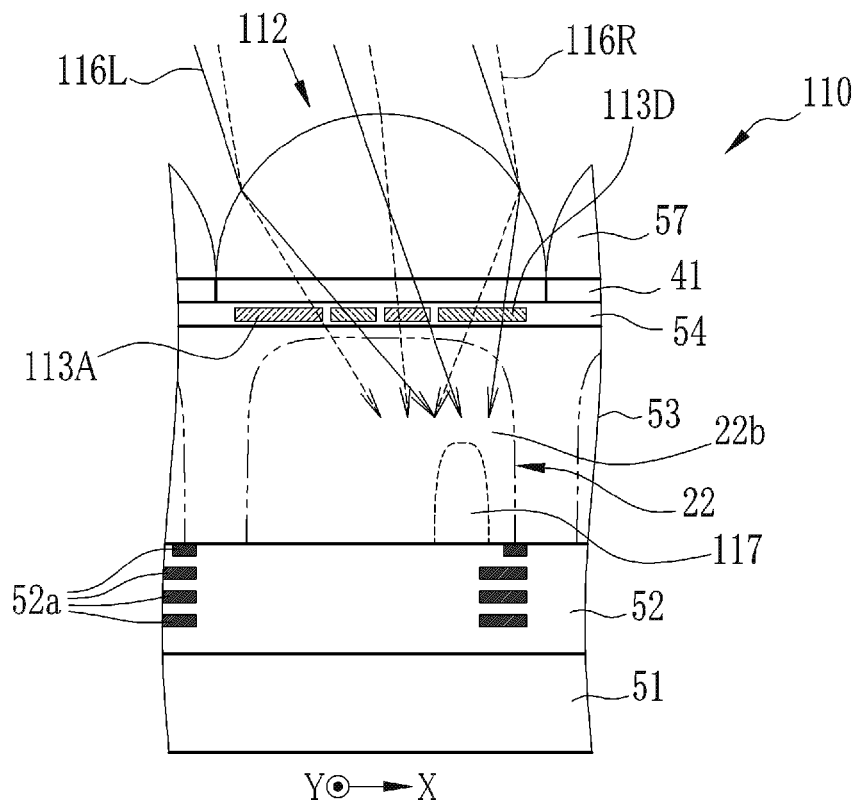
FIG. 13 is a cross-sectional view illustrating the charge storage region and incident light at a telephoto end position in a case where the zooming lens is used.

As illustrated in FIG. 13, in a case where the zooming lens is at the telephoto end (the longest focal length), the light incident angle is less acute than that of the case of the wide-angle end. For example, in a case where the hybrid pixel 112 is located in a right portion of the light receiving area 11, the right light beams 116R and the left light beams 116L are incident mostly on the right portion of the photoelectric conversion region 22*b*. For this reason, in the case where the effective region 115 is locally formed (distributed) only in the right half of the PD 22 in a manner similar to the case of the wide-angle end, both of the charge generated by the right light beams 116R and the charge generated by the left light beams 116L are stored. In other words, the information related to parallax cannot be obtained from the hybrid pixel 112. In the solid-state imaging device 110, in the case where the zooming lens is at the telephoto end, a negative voltage is applied to each of the three transparent electrodes 113A to 113C arranged in this order from the left. A positive voltage is applied only to the transparent electrode 113D which is located on the farthest right. Thereby, the width of the effective charge storage region 117 is reduced to half the width of the effective charge storage region for the wide-angle end. The effective charge storage region 117 is locally formed (distributed) only in the farthest right portion of the PD 22. Thereby the charge generated by the left light beams 116L is stored, while the charge generated by the right light beams 116R is discharged (discarded) even if both of the right and left light beams 116R and 116L enter the right half portion of the photoelectric conversion region 22*b*. Thus, the information related to the parallax is obtained from the hybrid pixel 112.

With the use of the hybrid pixels 42*a*, 42*b*, 82*a* to 82*d*, in each of which only two transparent electrodes are disposed in the left-right direction, of the first and second embodiments, it may become difficult to obtain the information related to the parallax at the telephoto-end position in the case where zooming lens is used. The hybrid pixel 112 in which the transparent electrodes are further divided in the left-right direction facilitates obtaining the information related to the parallax even if the zooming lens is used, thereby improving the accuracy of the phase detection AF.

Note that, in the case where the transparent electrodes are arranged in two-dimensions as those in each of the hybrid pixels 82*a* to 82*d* described in the second embodiment, the transparent electrodes in each hybrid pixel may be further divided not only in the left-right direction but also in the up-down direction or the like for obtaining the parallax. Thereby, the hybrid pixel becomes suitable for the zooming lens, in a manner similar to the hybrid pixel 112.

In FIGS. 12 and 13, the hybrid pixel 112 functions as the phase detection pixel which stores the charge generated by the left light beams 114L or 116L. In a case where the signs of the voltages applied to the transparent electrodes 113A to 113D are reversed or changed, the hybrid pixel 112 functions as the phase detection pixel which stores the charge generated by the right light beams 114R or 116R.

Figure 14:
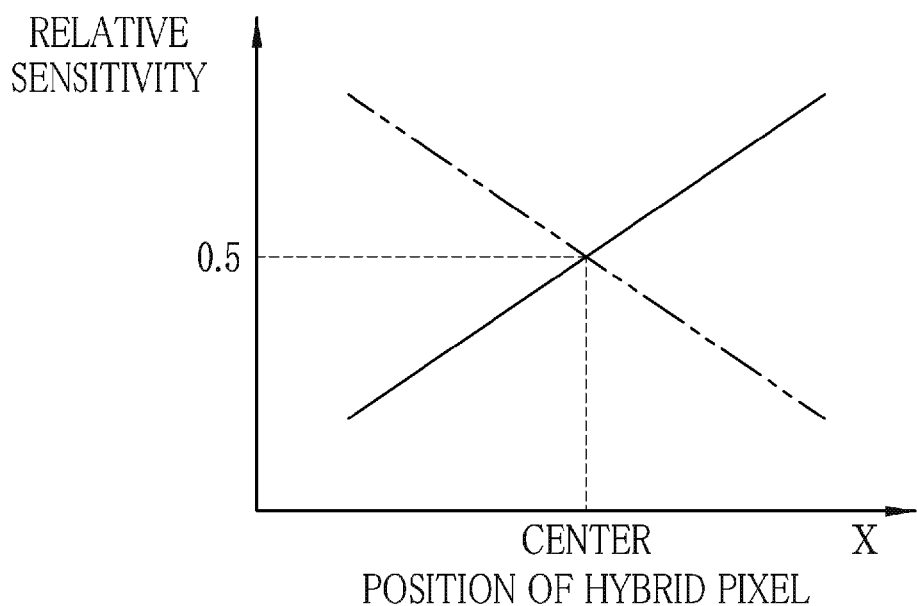
FIG. 14 is a graph illustrating a relationship between the position of a hybrid pixel in a light receiving area and relative sensitivity.
Figure 15:
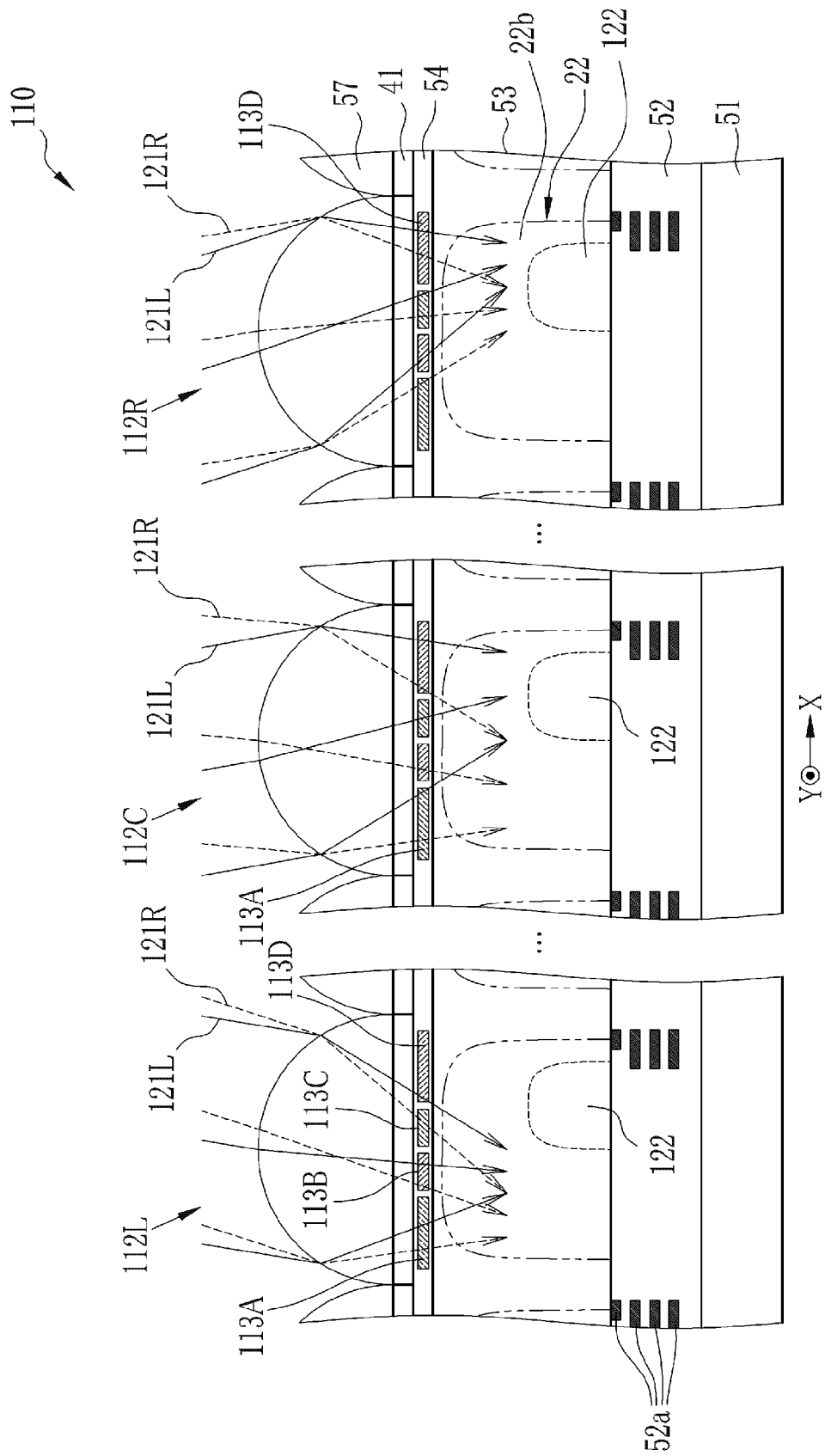
FIG. 15 is a cross-sectional view illustrating the incident light and the charge storage regions in a case where the charge storage regions are controlled uniformly irrespective of their positions in the light receiving area.

In a graph illustrated in FIG. 14, the horizontal axis represents a position of the hybrid pixel 112 in the light receiving area 11 and the vertical axis represents the relative sensitivity of the hybrid pixel 112 in which the effective charge storage region is locally formed (distributed) only in the right half portion of the charge storage region 22*a*. The relative sensitivity refers to a ratio of sensitivity of the hybrid pixel 112 to the sensitivity of the normal pixel 43. As illustrated in FIG. 15, in the case where a negative voltage is applied to each of the transparent electrodes 113A and 113B located on the left side and a positive voltage is applied to each of the transparent electrodes 113C and 113D on the right side, an effective charge storage region 122 with half the width of the charge storage region 22*a* is locally formed (distributed) only in the right portion of the charge storage region 22*a*. Thereby the hybrid pixel 112 functions as the phase detection pixel which selectively stores the charge generated in the right portion of the photoelectric conversion region 22*b*. In this case, as indicated by the solid line in FIG. 14, the relative sensitivity of the hybrid pixel 112C located at the center of the light receiving area 11 is 0.5. The relative sensitivity of a hybrid pixel 112R, which is located in a right portion of the light receiving area 11 is higher than 0.5. The relative sensitivity of a hybrid pixel 112L, which is located in a left portion of the light receiving area 11 is lower than 0.5.

As is obvious from FIG. 15, the relative sensitivity of the hybrid pixel varies depending on the position of the hybrid pixel in the light receiving area 11 because the light incident angle varies depending on the position of the hybrid pixel in the light receiving area 11. To be more specific, the light incident angle on the hybrid pixel 112C, which is located at the center of the light receiving area 11, is small, so that the right light beams 121R of the incident light enter the left portion of the photoelectric conversion region 22*b* while the left light beams 121L of the incident light enter the right portion of the photoelectric conversion region 22*b*. Thereby the charge generated by the left light beams 121L is selectively stored in the effective charge storage region 122 locally formed (distributed) in the right portion (the right half). In the hybrid pixel 112 located at the center, the charge to be stored in the charge storage region 122 is generated by the left light beams 121L, which occupy approximately half of the incident light. Therefore the relative sensitivity is approximately 0.5.

The light incident angle on the hybrid pixel 112R, which is located in the right portion (downstream side in the X direction) of the light receiving area 11, is inclined toward the center direction of the light receiving area 11. Both of the left light beams 121L and the right light beams 121R enter the right portion of the photoelectric conversion region 22*b*, so that both of the charge generated by the left light beams 121L and the charge generated by the right light beams 121R are stored in the charge storage region 122. Therefore the relative sensitivity of the hybrid pixel 112R, which is located in the right portion of the light receiving area 11, is higher than that of the hybrid pixel 112C, which is located at the center. However, the S/N ratio is not satisfactory, and it is difficult to obtain the information related to the parallax.

On the other hand, both of the left light beams 121L and the right light beams 121R enter the left portion of the photoelectric conversion region 22*b* in the hybrid pixel 112L, which is located in the left portion in the light receiving area 11. Therefore, both of the charge generated by the left light beams 121L and the charge generated by the right light beams 121R are not likely to be stored in the charge storage region 122, so that the relative sensitivity is small relative to that of the hybrid pixel 112C, which is located at the center.

Figure 16:
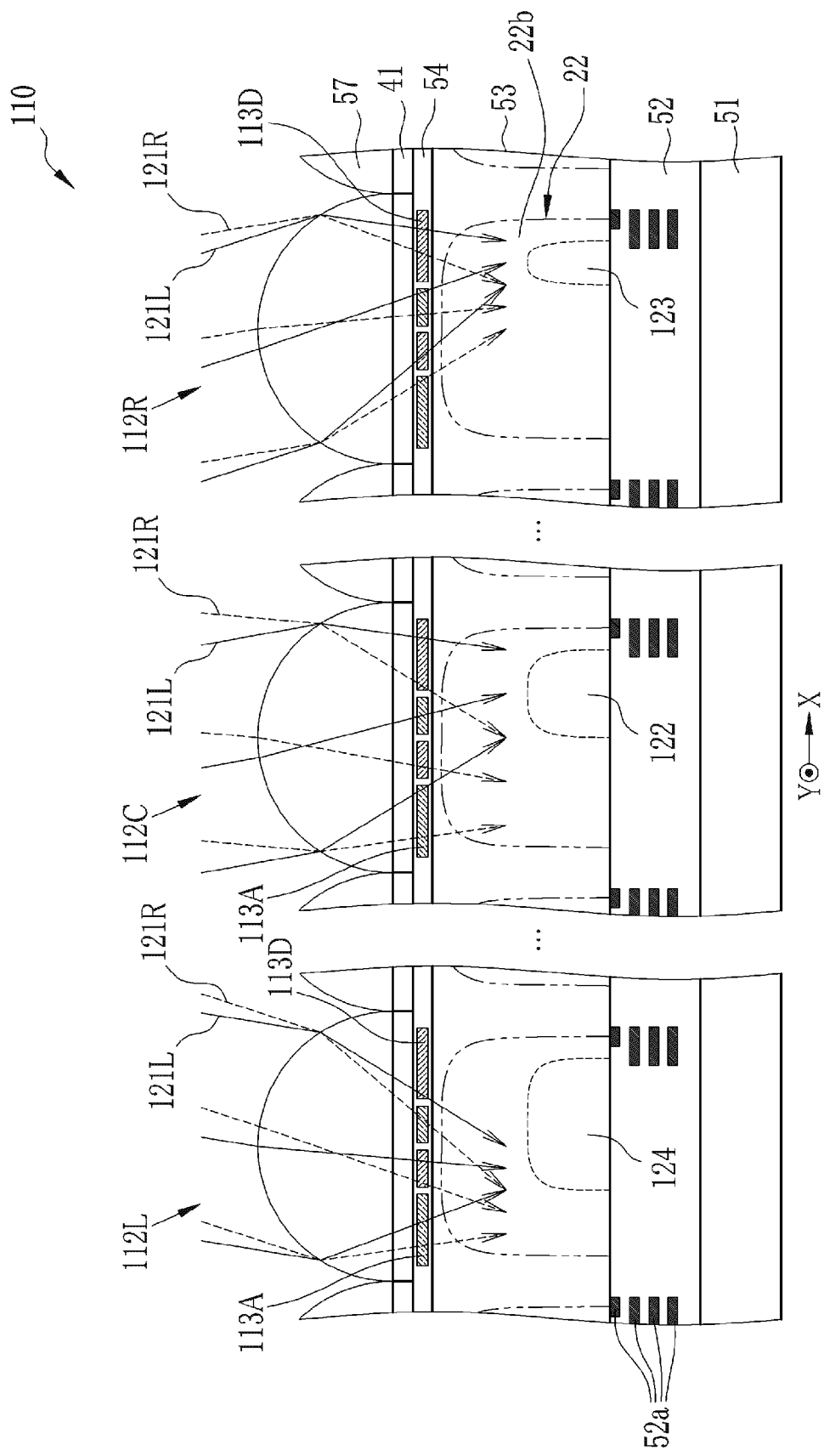
FIG. 16 is a cross-sectional view illustrating the incident light and the charge storage regions in a case where the charge storage regions are controlled in accordance with their positions in the light receiving area.

As described above, in the case where the S/N ratio is not satisfactory or the relative sensitivity is small, the accuracy of the phase detection AF is reduced. However, as illustrated in FIG. 16, the S/N ratio and the relative sensitivity are improved by controlling the width of the effective charge storage region of each hybrid pixel 112 in accordance with the position of the hybrid pixel 112 in the light receiving area 11. To be more specific, in the hybrid pixel 112C, which is located at the center, a negative voltage is applied to each of the transparent electrodes 113A and 113B and a positive voltage is applied to each of the transparent electrodes 113C and 113D. Thereby the effective charge storage region 122 occupies approximately the right half of the charge storage region 22*a* (see FIG. 11) (in other words, the effective charge storage region 122 is locally formed (distributed) in approximately the right half of the charge storage region 22*a*). In the hybrid pixel 112R, which is located in the right portion of the light receiving area 11, a negative voltage is applied to each of the transparent electrodes 113A to 113C and a positive voltage is applied to the transparent electrode 113D. Thereby an effective charge storage region 123 occupies approximately the right quarter (¼) of the charge storage region 22a (in other words, the effective charge storage region 123 is locally formed (distributed) in approximately the right quarter (¼) of the charge storage region 22a). In the hybrid pixel 112L, which is located in the left portion of the light receiving area 11, a negative voltage is applied to the transparent electrode 113A and a positive voltage is applied to each of the transparent electrodes 113B to 113D. Thereby an effective charge storage region 124 occupies approximately ¾ of the charge storage region 22a toward the right (in other words, the effective charge storage region 124 is locally formed (distributed) in approximately ¾ of the charge storage region 22a toward the right).

With regard to the hybrid pixel 112R, which is located in the right portion of the light receiving area 11, the charge generated by the right light beams 121R is not stored in the case where the effective charge storage region 123 is locally formed (distributed) only in the right portion of the PD 22 and the width of the effective charge storage region 123 is reduced, and this is more so as the position of the hybrid pixel 112R is closer to the right end of the light receiving area 11. The relative sensitivity of the hybrid pixel 112R is reduced to a level substantially the same as that of the hybrid pixel 112C, which is located at the center. However, the S/N ratio is improved. Thereby the accuracy of the phase detection AF using the hybrid pixel 112R is improved. With regard to the hybrid pixel 112L, which is located in the left portion of the light receiving area 11, the amount of the stored charge, which is generated by the left light beams 121L, increases as the width of the effective charge storage region 124 is increased toward the left, and this is more so as the position of the hybrid pixel 112L is closer to the left end of the light receiving area 11. Thereby the relative sensitivity is improved. Thus, the accuracy of the phase detection AF using the hybrid pixel 112L is improved.

In FIG. 16, in the hybrid pixel 112L located in the left portion of the light receiving area 11, the effective charge storage region 124 with ¾ the width of the charge storage region 22a is only formed (distributed) in the right portion of the charge storage region 22a. Instead, a negative voltage is applied to the transparent electrodes 113A, 113C, and 113D and a positive voltage is applied only to the transparent electrode 113B which is second from the left end. Thereby an effective charge storage region is locally formed (distributed) only immediately below at around the light reaching points of the left light beams 121L.

In the case where the hybrid pixel 112 selectively stores the charge generated by the right light beams 121R, the relative sensitivity decreases as the position of the hybrid pixel 112 is closer to the right end and the sensitivity factor increases as the position of the hybrid pixel 112 is closer to the left end, as indicated by a broken line in FIG. 14. However, the S/N ratio is not satisfactory. In the case where the charge generated by the right light beams 121R is selectively stored, the signs of the voltages applied to the transparent electrodes 113A to 113D are reversed from those of the case where the charge generated by the left light beams 121L is selectively stored.

In the case where three or more transparent electrodes are used in one hybrid pixel, the accuracy of the phase detection AF is improved by changing the width of the charge storage region based on the position of the hybrid pixel in the light receiving area 11, irrespective of the type of the taking lens. However, it is particularly preferred to use the zooming lens as the taking lens because the use of the zooming lens with the hybrid pixel 112 reduces the reduction in accuracy of the phase detection AF at the telephoto end and the reduction in accuracy of the phase detection AF due to the relationship between the position of the hybrid pixel 112 in the light receiving area 11 and the incident angle of the light.

In FIGS. 15 and 16, the hybrid pixel 112 having the four transparent electrodes 113A to 113D is used by way of example. With the use of at least two transparent electrodes, the width of the charge storage region is adjusted based on the position of the hybrid pixel 112 in the light receiving area 11. For example, in the case of arranging the two transparent electrodes 55A and 55B side by side in the left-right direction as described in the first embodiment illustrated in FIG. 3, the sizes of the transparent electrodes 55A and 55B are adjusted in advance based on the position of each of the hybrid pixels 42a and 42b in the light receiving area 11. With regard to the hybrid pixel 42a, in which the charge generated in the right portion of the photoelectric conversion region 22b is stored, the size (area) of the transparent electrode 55B is increased as the position of the hybrid pixel 42a is located toward the right. The size (area) of the transparent electrode 55A is reduced as the size of the transparent electrode 55B is increased. Note that only the size of the transparent electrode 55A may be reduced. With regard to the hybrid pixel 42b, in which the charge generated in the left portion of the photoelectric conversion region 22b is stored, the size (area) of the transparent electrode 55A is increased as the position of the hybrid pixel 42b is located toward the left. The size (area) of the transparent electrode 55B is reduced as the size of the transparent electrode 55A is increased. Note that this also applies to the case where the four electrodes 82A to 82D are arranged two-dimensionally as described in the second embodiment.

Figure 17:
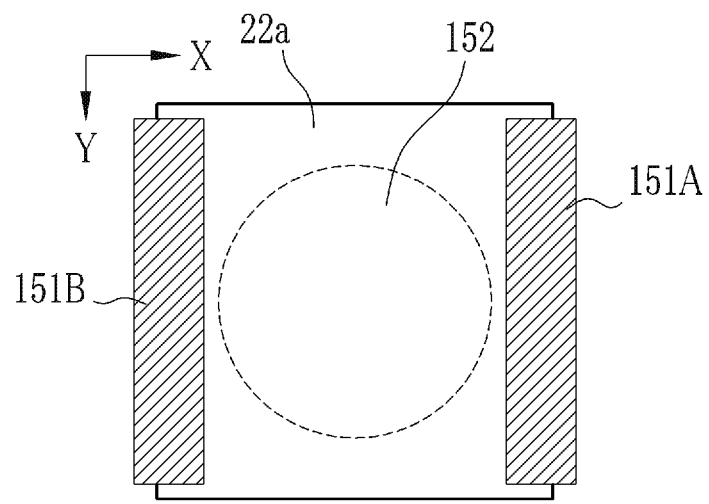
FIG. 17 is an explanatory view illustrating an arrangement of electrodes in a case where opaque electrodes are used.

In the first and second embodiments, the hybrid pixel is formed with the transparent electrodes by way of example. Opaque electrodes may be used in place of the transparent electrodes. For example, as illustrated in FIG. 17, opaque electrodes 151A and 151B are provided to a right edge portion and a left edge portion of the charge storage region 22a, respectively. The electrodes 151A and 151B are provided not to overlap an area (hereinafter referred to as the light collecting area) 152, in which the microlens 57 collects the incident light, so as not to block the incident light. The electrodes 151A and 151B correspond to the transparent electrodes 55A and 55B of the first embodiment. For example, in a case where a positive voltage is applied to the electrode 151A and a negative voltage is applied to the electrode 151B, the effective charge storage region is locally formed (distributed) only in the right portion. In a case where four electrodes are arranged in two-dimensions as described in the second embodiment, the opaque electrodes 153A to 153D are arranged at the four respective corners of the charge storage region 22a as illustrated in FIG. 18.

Figure 18:
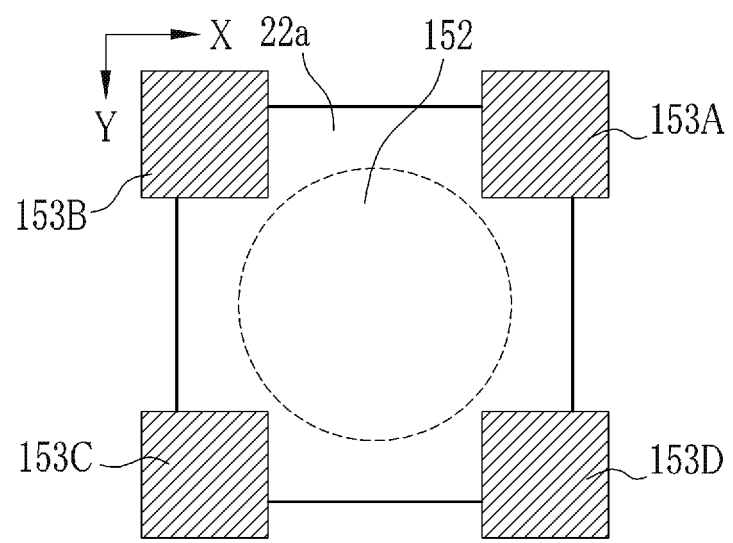
FIG. 18 is an explanatory view illustrating an arrangement of the electrodes in a case where four opaque electrodes are used.
Figure 19:
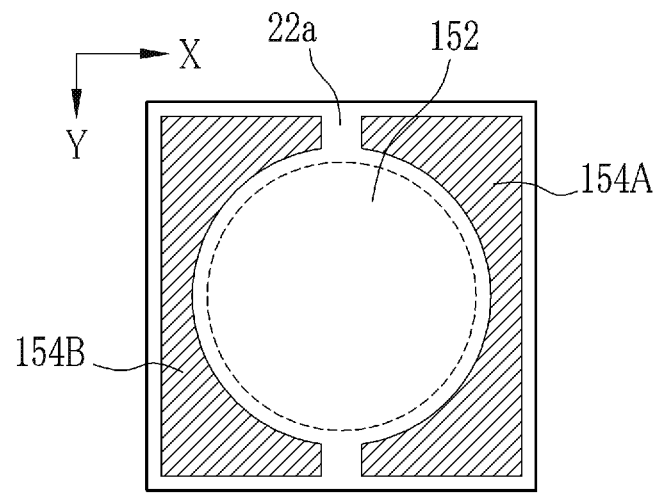
FIG. 19 is an explanatory view illustrating another example in which opaque electrodes of a different shape are used.
Figure 20:
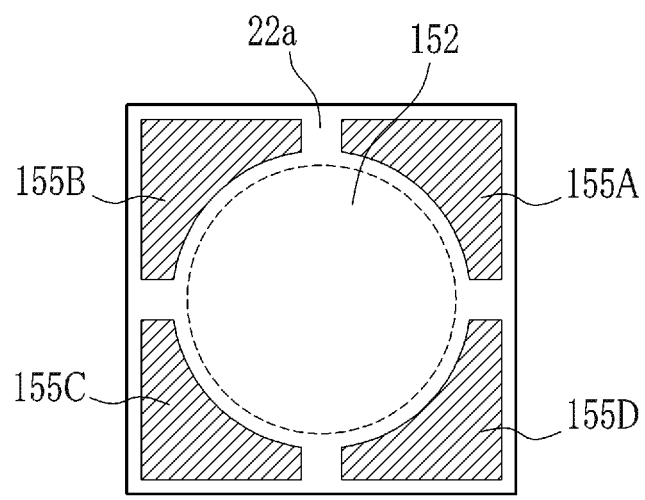
FIG. 20 is an explanatory view illustrating another example in which 4 opaque electrodes of a different shape are used.

In FIGS. 17 and 18, the opaque rectangular electrodes are formed at the right and left edge portions or at the four corners of the charge storage region 22a. The shape, the size, or the like of each opaque electrode may be changed arbitrarily as long as the opaque electrode does not overlap the light collecting area 152. For example, as illustrated in FIG. 19, each of two opaque electrodes 154A and 154B disposed to the right and the left of the light collecting area 152 has a substantially semicircular cutout portion, which corresponds to the light collecting area 152. In a like manner, as illustrated in FIG. 20, each of four opaque electrodes 155A to 155D has a cutout portion in the shape of a segment of a circle, which corresponds to the light collecting area 152. With the use of the electrodes with the cutout portions, which correspond to the light collecting area 152, the width or the like of the charge storage region 22a is controlled more precisely than that controlled by providing the rectangular electrodes to the right and left edge portions or the four corners of the charge storage region 22a. The material of the opaque electrodes is chosen arbitrarily as long as it is conductive. For example, metal such as aluminum may be used.

Figure 21:
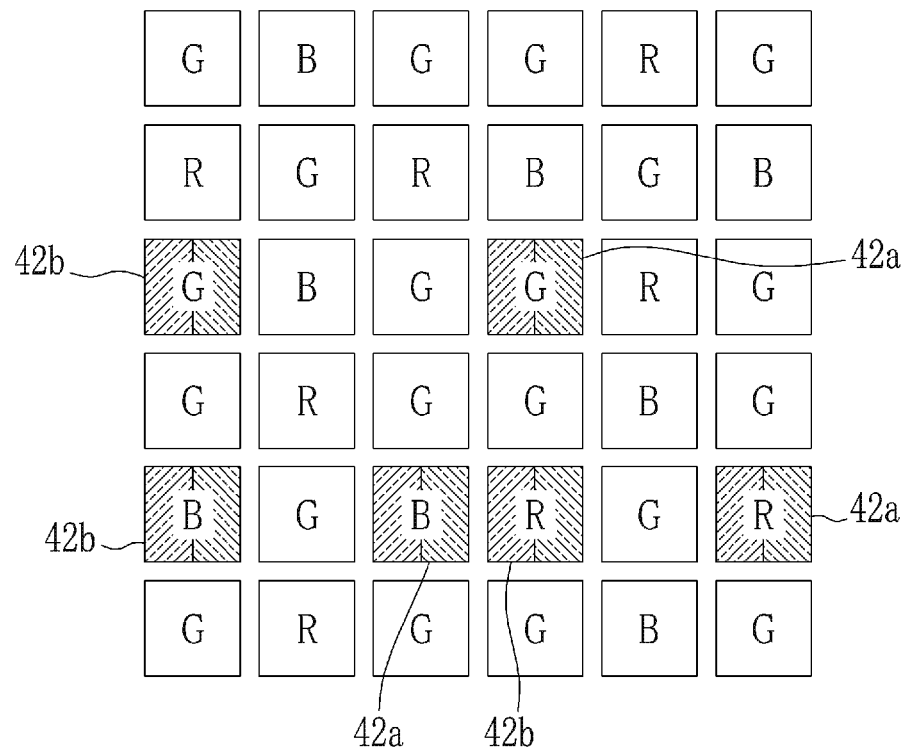
FIG. 21 is an explanatory view illustrating an example in which red and blue pixels are the hybrid pixels.

In FIG. 21, the G, R, and B pixels are used as the hybrid pixels by way of example. All the hybrid pixels may be the R pixels or the B pixels. Only two types out of the three types (R, G, and B) of pixels may be used as the hybrid pixels.

Figure 22:
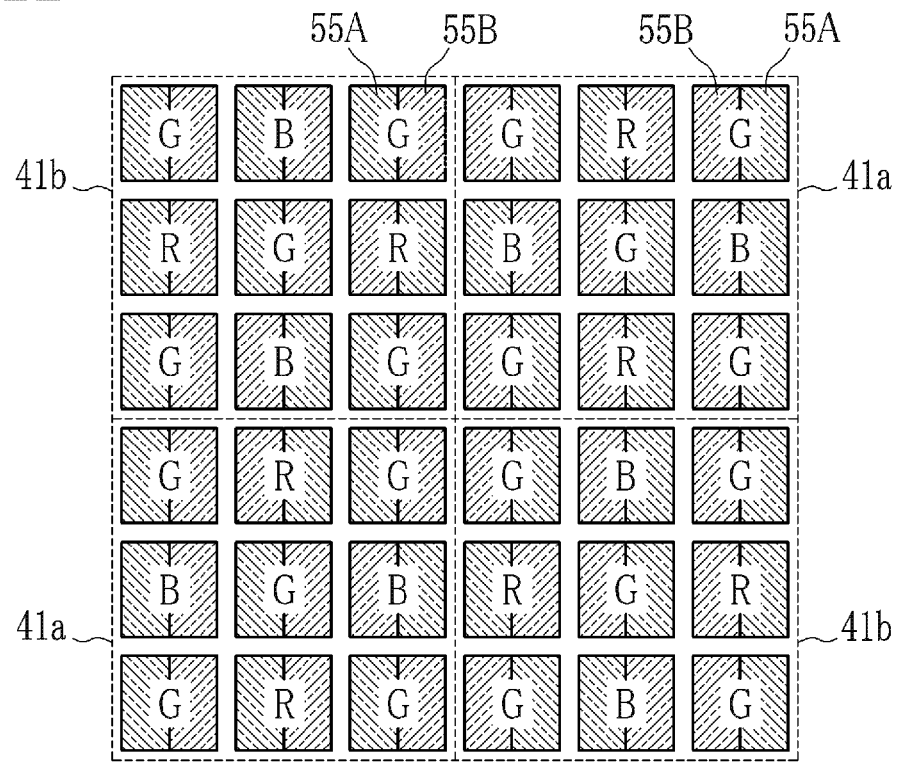
FIG. 22 is an explanatory view illustrating an example in which all pixels are the hybrid pixels.

In FIG. 22, all of the pixels in the light receiving area 11 are the hybrid pixels. In a conventional solid-state imaging device, the phase detection pixels are provided to fixed positions, so that the AF area capable of the focus adjustment is also fixed. In the case where all of the pixels are the hybrid pixels, the focus adjustment is performed in any region of the imaging field.

Figure 23:
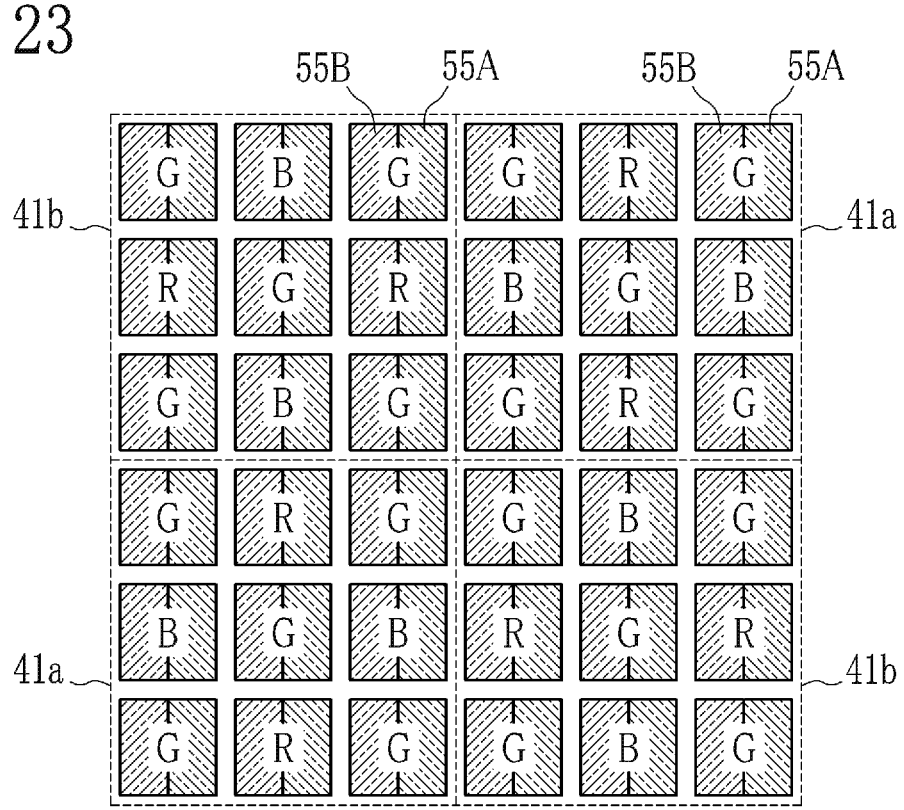
FIG. 23 is an explanatory view illustrating another example in which all pixels are the hybrid pixels.

In FIG. 22, the hybrid pixel 42a, in which the transparent electrode 55A is disposed on its right portion, and the hybrid pixel 42b, in which the transparent electrode 55A is disposed on its left portion, are mixed. As illustrated in FIG. 23, for example, all of the pixels may be the hybrid pixels 42a with the transparent electrodes 55A disposed in their respective right portions. For example, in one frame, a positive voltage is applied to the transparent electrode 55A and a negative voltage is applied to the transparent electrode 55B, so that imaging is performed by selectively storing the charges generated by the light received with the right portions of all the pixels. In a next frame, a negative voltage is applied to the transparent electrode 55A and a positive voltage is applied to the transparent electrode 55B, so that imaging is performed by selectively storing the charges generated by the light received with the left portions of all the pixels. Thus the phase detection AF is performed by using the pixel signals of the two successive frames. In a case where the image obtained from the first frame is used as a right perspective image and the image obtained from the second frame is used as a left perspective image, a parallax image for stereoscopy is obtained. In other words, switching between 2D imaging, in which all the pixels are used as the normal pixels to take a normal image, and 3D imaging is facilitated. Since all the pixels are used, images with high resolution are produced in the 2D imaging and 3D imaging.

Figure 24:
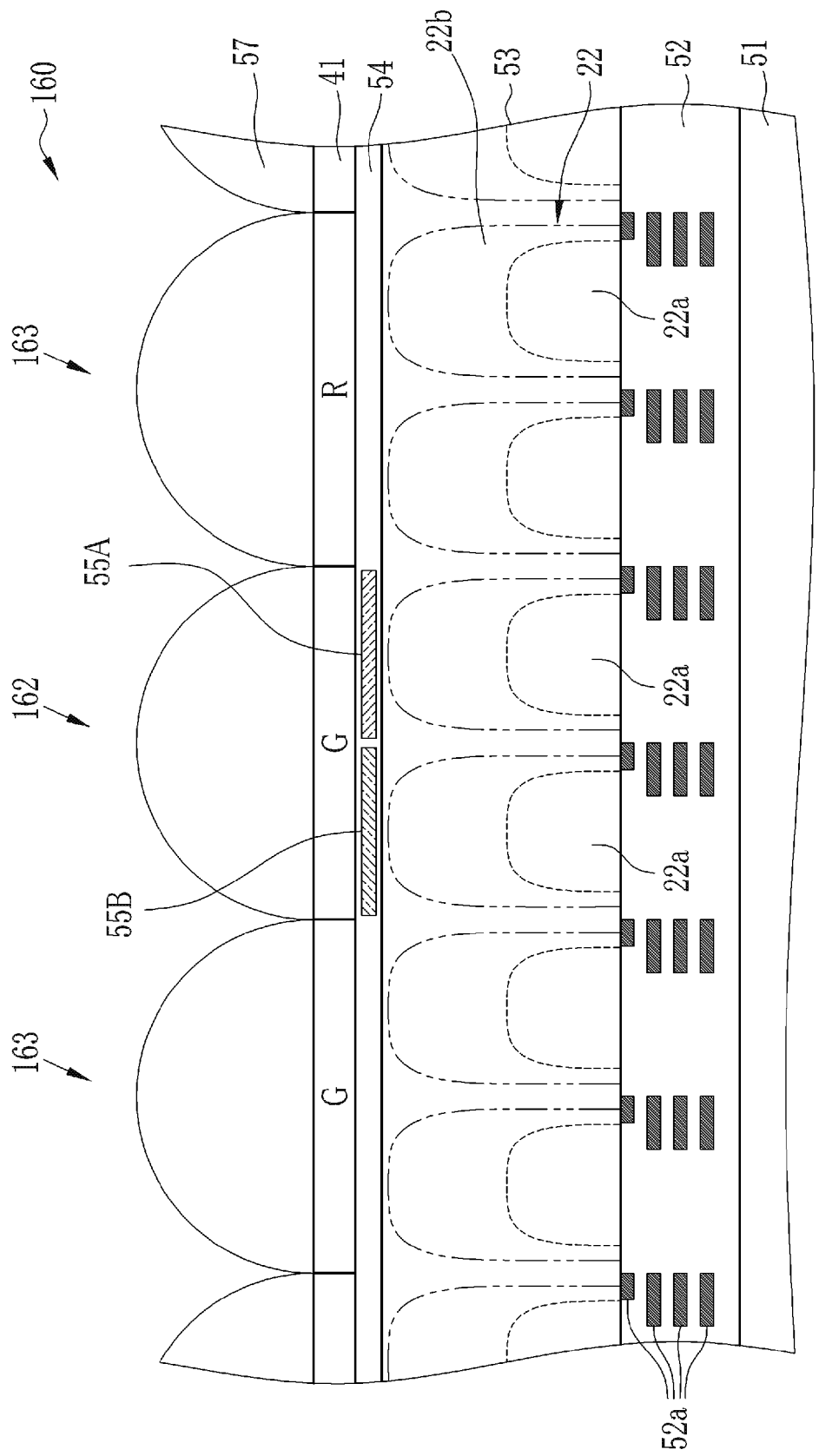
FIG. 24 is an explanatory view illustrating an example in which two PDs are provided to each pixel.

In a solid-state imaging device 160 illustrated in FIG. 24, each pixel is provided with two PDs 22. Note that each pixel is provided with one color segment of the color filter 41 and one microlens 57. In the solid-state imaging device 160, the charges generated in the two PDs 22 are added together and outputted as the pixel signal of one pixel. In this case, in a hybrid pixel 162, the transparent electrode 55A is provided to one of the PDs 22. The transparent electrode 55B is provided to the other PD 22. A positive (or a negative) voltage is applied to the transparent electrode 55A. A negative (or a positive) voltage is applied to the transparent electrode 55B. Thereby, the hybrid pixel 162 functions as the phase detection pixel. Note that the four transparent electrodes 85A to 85D may be provided as described in the second embodiment. In this case, each pixel is provided with four PDs 22. In the case where each pixel is provided with two or more PDs, each PD is independent, so that there is no charge transfer between the PDs 22, resulting in little noise. Thus, the phase detection AF is performed with high accuracy.

Figure 25:
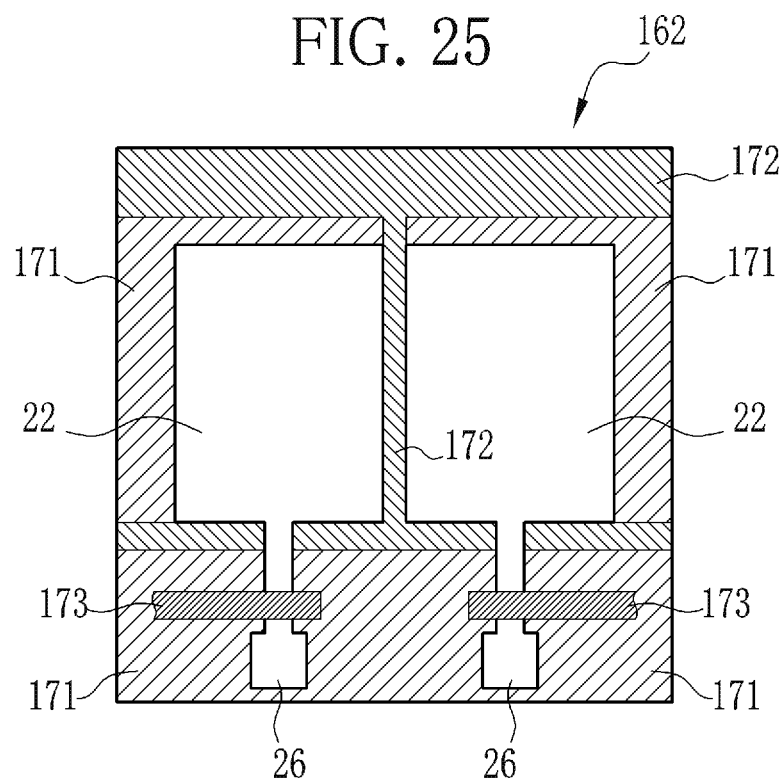
FIG. 25 is an explanatory view illustrating an example in which a region between the two PDs in a pixel is made of p++.

In the case where each pixel is provided with two or more PDs 22, as illustrated in FIG. 25, it is preferred to form an element isolation region 171, which is located between the pixels, from p+ and then form an element isolation region 172, which is located between the PDs 22, from p++ with more amount of additive(s) or dopant(s). Thereby, a potential barrier of the element isolation region 172 with respect to the electrons becomes higher than that of a normal element isolation region 171. As a result, the charge transfer between two PDs 22 is prevented more reliably. For example, in a case where a negative voltage is applied to a transparent electrode which corresponds to one of the two PDs 22 and a positive voltage is applied to a transparent electrode which corresponds to the other PD 22, the electron generated in the PD 22 to which the negative voltage is applied cannot pass (tunnel) through the potential barrier of the element isolation region 172, so that it does not flow into another PD 22 to which a negative voltage is not applied. In the PD to which the negative voltage is applied, the charge is generated by photoelectric conversion. However, the charge generated is not stored due to the application of the negative voltage, and discharged through wiring (not shown) connected to ground.

In FIG. 25, it is preferred that each PD 22 is provided with the FD 26 and a read gate 173 so that the charge is read out from each PD 22 without mixing the charges of the two PDs 22. Thereby the charge transfer between the PDs 22 is prevented more reliably.

In FIGS. 24 and 25, each of a normal pixel 163 and the hybrid pixel 162 is provided with two PDs 22. Instead, only the hybrid pixel 162 may be provided with two or more PDs 22.

Figure 26:
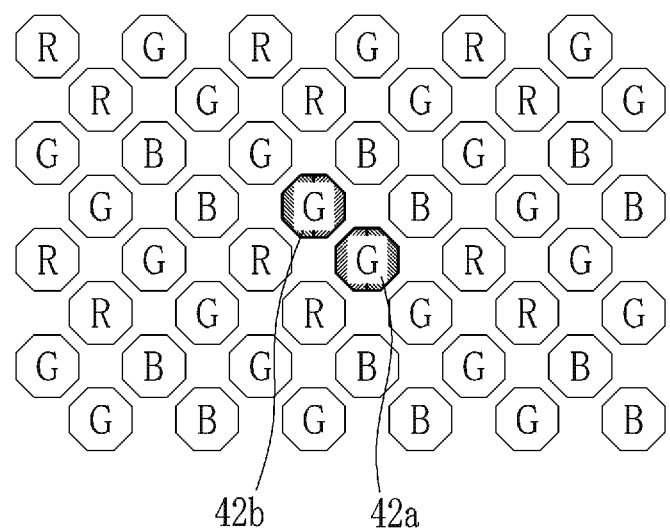
FIG. 26 is an explanatory view illustrating a solid-state imaging device with a honeycomb array.
Figure 27:
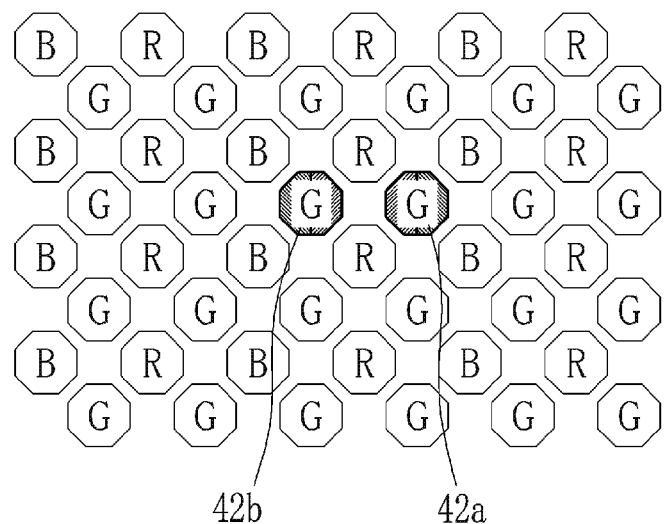
FIG. 27 is an explanatory view illustrating a solid-state imaging device with another type of honeycomb array.

In FIG. 26 and FIG. 27, the solid-state imaging devices with the pixels in honeycomb arrays are illustrated. In each honeycomb array, the color arrangement of the color filter may be arbitrary. In FIG. 26, the row of the G pixels and the row in which R pixels and B pixels are arranged on a two-by-two basis are arranged alternately in an oblique 45-degree direction. In FIG. 27, the same rows each having the R pixel, the G pixel, and B pixel are arranged alternately in an oblique 45-degree direction.

Figure 28:
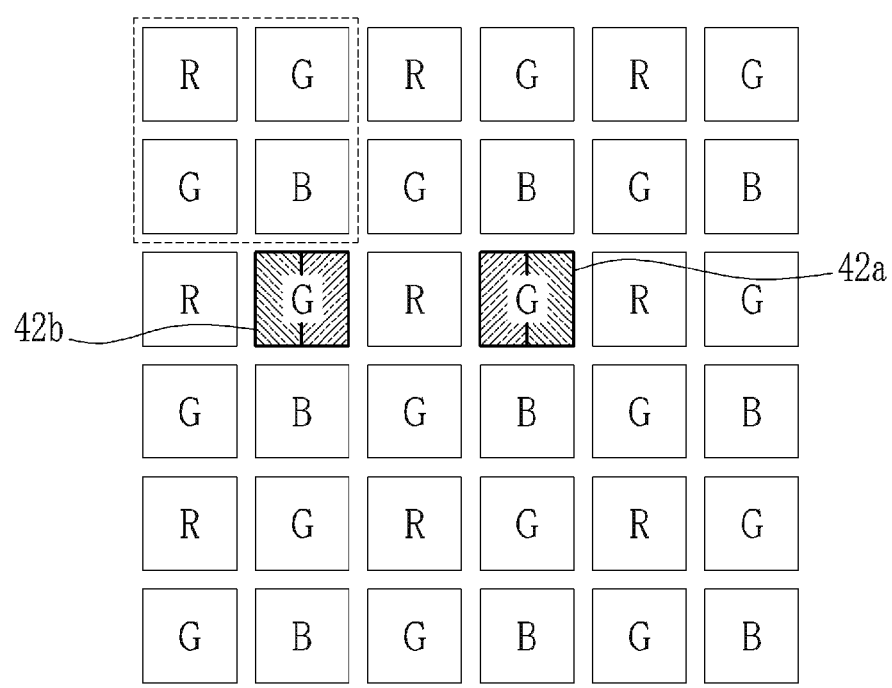
FIG. 28 is an explanatory view illustrating a solid-state imaging device with color filters arranged in Bayer array.

In the first and second embodiments, the color filters 41 in units of 6×6 pixels are used by way of example. The color arrangement of the color filters 41 may be arbitrary. For example, in a case where pixels are arranged in a square array, as illustrated in FIG. 28, the pixels may be arranged in the so-called Bayer array in which units of 2×2 pixels indicated by broken lines are arranged in up-down and left-right directions.

Figure 29:
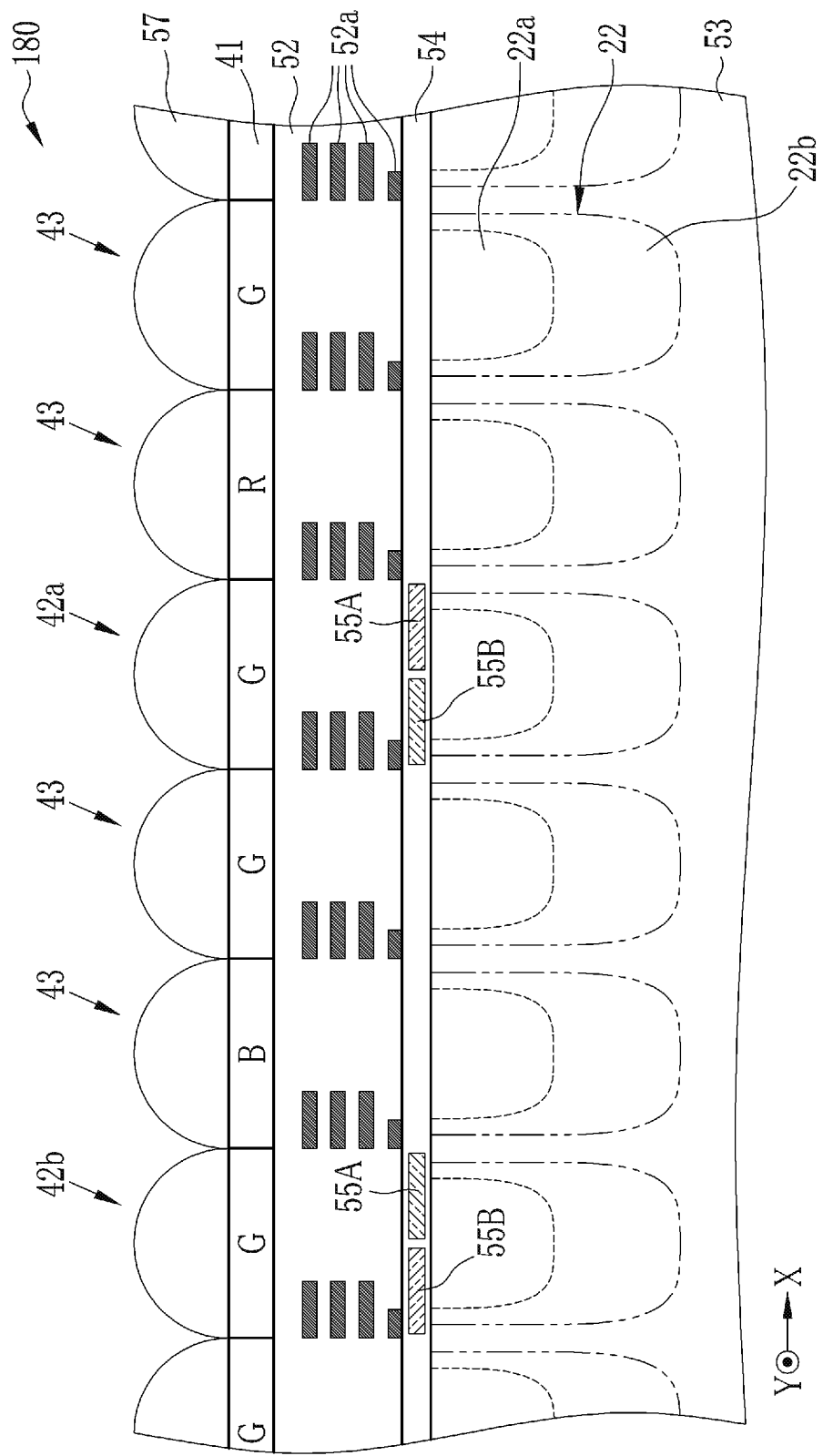
FIG. 29 is a cross-sectional view illustrating a solid-state imaging device of a front-side illuminated type.

FIG. 29 illustrates a solid-state imaging device 180 of a front side illuminated (FSI) type. In the solid-state imaging device 180, the wiring layer 52, the color filter 41, and the microlens 57 are stacked on the p-type semiconductor substrate 53 in this order (i.e. the microlens 57 is on the top), and the light is incident on the PD 22 from the front side through the wiring layer 52. The transparent electrode layer 54 is provided, for example, between the p-type semiconductor substrate 53 and the wiring layer 52 (in other words, over the surface of the p-type semiconductor substrate 53). As long as the potential of the PD 22 is controlled by the transparent electrodes 55A and 55B of the transparent electrode layer 54, the transparent electrode layer 54 may be provided below the PD 22 (in other words, the back side of the p-type semiconductor substrate 53) even in the FSI type solid-state imaging device 180.

In the first and second embodiments, in the case where the hybrid pixels function as the phase detection pixels, the pair of hybrid pixels are provided in the same row (or column) (in the second embodiment, the same row and the same column). The pair of the hybrid pixels may be provided in different rows or different columns.

One pixel has three transistors: Tr 23, Ta 24, and Ts 25. The number of transistors and the like of each pixel may be changed arbitrary. For example, each pixel may be provided with four transistors by providing a transistor for transfer between the PD 22 and FD.

In the back-side illuminated type solid-state imaging device, the transparent electrode layer 54 is provided on the back side of the p-type semiconductor substrate 53. As long as the potential of the PD 22 is controlled by the transparent electrodes, the order of stacking the transparent electrode layer 54 may be changed as necessary. For example, the transparent electrode layer 54 may be provided between the color filter 41 and the microlens 57. However, the closer the distance between the transparent electrode and the PD 22, the better the control. Therefore it is preferred that the transparent electrode layer 54 is formed over the p-type semiconductor substrate 53.

The color filters 41 of three additive primary colors (B, G, and R) is used by way of example. The color filter of three subtractive primary colors (Y, M, and C) may be used. The color filters may include a colorless (transparent) filter, a filter of a specific color, or the like. The hybrid pixel may be provided with a colorless filter.

In the first embodiment, the information related to the parallax in the left-right direction is obtained from the hybrid pixels 42a and 42b. In the second embodiment, the information related to the parallax in each of the up-down direction, the left-right direction, and the oblique direction is obtained from the hybrid pixels 82a to 82d. Alternatively or in addition, the parallax information in the left-right direction and the up-down direction may be obtained from the hybrid pixels 42a and 42b of the first embodiment and the two hybrid pixels arranged in the up-down direction by rotating the hybrid pixels 42a and 42b by 90 degrees.

The same voltage is applied uniformly to the transparent electrodes of the same type among all the hybrid pixels. The voltage applied to the transparent electrode may be controlled on a hybrid pixel basis. Particularly, in the case where all of the pixels are the hybrid pixels, individual control of a transparent electrode of each pixel facilitates switching between 2D imaging and 3D imaging.

The transparent electrode layer 54 is provided between the p-type semiconductor substrate 53 and the color filter 41, so that the potential of the PD 22 of the hybrid pixel is controlled from the underside (back side). Alternatively, the transparent electrode layer 54 may be provided between the p-type semiconductor substrate 53 and the wiring layer 52, so that the PD 22 of the hybrid pixel is controlled from the front side. In this case, an opaque material may be used to form electrodes instead of the transparent electrodes 55A, 55B, and the like.

Each hybrid pixel is provided with two or more transparent electrodes for controlling the potential of the PD 22, by way of example. Each hybrid pixel may be provided with only one electrode. For example, in the case of the hybrid pixels 42a and 42b of the first embodiment, the transparent electrode 55A may be omitted and only the transparent electrode 55B may be provided. In this case, the potential of the PD 22 is controlled by applying a negative voltage to the transparent electrode 55B so as to retain the charge storage region only immediately below a portion with no electrode (a portion corresponding to the transparent electrode 55A in the first embodiment). However, the use of two or more electrodes provides better control over the potential (i.e. the shape of the charge storage region or the like) in narrowing the charge storage region 22a of the PD 22 than that provided by applying a negative voltage to one electrode. Therefore, it is preferred to provide two or more electrodes as described in the first and second embodiments.

In the case where the hybrid pixel functions as the phase detection pixel, a positive voltage is applied to an electrode (for example, the transparent electrode 55A of the first embodiment) located in an area or a position where the charge storage region is to be formed (or distributed) locally. Instead, the electrode located in the position where the charge storage region is to be formed locally may be provided with zero voltage (or grounded). For example, in the first embodiment, a negative voltage is applied to the transparent electrode 55B and the transparent electrode 55A is set to zero voltage. Thereby, the charge storage region is locally formed (distributed) only below the transparent electrode 55A. However, it is preferred to apply a positive voltage to the transparent electrode 55A because it provides excellent control over the potential.

The hybrid pixels are distributed uniformly in the light receiving area 11, by way of example. At least a pair of hybrid pixels (two hybrid pixels) is necessary for the phase detection AF. In the case where pairs of hybrid pixels are provided, the number and the arrangement of the pairs of hybrid pixels may be determined as necessary.

The solid-state imaging device of the present invention may adopt a CMOS image sensor or a CCD image sensor as long as it performs the phase detection AF. The solid-state imaging device using the hybrid pixels 112 having three or more transparent electrodes is particularly suitable for a low-profile or small camera unit or the like (e.g. a camera unit incorporated in a low-profile digital camera, mobile phone, PDA, smartphone, or the like) in which a principal ray angle tends to increase at the peripheral portions thereof.

Various changes and modifications are possible in the present invention and may be understood to be within the present invention.

What is claimed is:

1. A solid-state imaging device comprising:
   a plurality of hybrid pixels each comprising a photoelectric conversion region for photoelectrically converting incident light from a subject into a charge corresponding to an amount of the incident light, a charge storage region for storing the charge generated in the photoelectric conversion region, and a potential modulation electrode for applying a voltage to the charge storage region to modulate a potential with respect to the charge and thereby narrowing a width of the charge storage region to locally form the charge storage region,
   the hybrid pixel functioning as a normal pixel for evenly storing the charge generated in the photoelectric conversion region in a case where the width of the charge storage region is not narrowed, the hybrid pixel functioning as a phase detection pixel for selectively storing the charge generated in a part of the photoelectric conversion region in a case where the voltage is applied to the potential modulation electrode to narrow the width of the charge storage region, the hybrid pixel comprising two or more photodiodes, the each photodiode having the photoelectric conversion region and the charge storage region,
an amount of a dopant being greater and the potential with respect to the charge being higher in an isolation region for interfering with charge transfer between the photodiodes than in an isolation region for interfering with charge transfer between the adjacent pixels.

2. The solid-state imaging device according to claim 1, wherein the potential modulation electrode has two or more electrodes to each of which a voltage is applied independently, and a negative voltage is applied to at least one of the electrodes to locally form the charge storage region below the other of the electrodes.

3. The solid-state imaging device according to claim 2, wherein a positive voltage is applied to the electrode which corresponds to a position where the charge storage region is to be locally formed.

4. The solid-state imaging device according to claim 2, wherein the potential modulation electrode has first and second electrodes whose application voltages are controllable, and
the hybrid pixels are composed of a first hybrid pixel, in which the first electrode and the second electrode are arranged in this order in a first direction, and a second hybrid pixel, in which the first and second electrodes are arranged in a reverse order to the order in the first hybrid pixel, and
a first voltage is applied to the first electrode of each of the first and second hybrid pixels and a second voltage is applied to the second electrode of each of the first and second hybrid pixels.

5. The solid-state imaging device according to claim 4, wherein the potential modulation electrode has three or more electrodes arranged in the first direction.

6. The solid-state imaging device according to claim 5, wherein in a case where an image of a subject is formed on a light receiving area, in which a plurality of pixels including the hybrid pixels are arranged, with a zooming lens capable of adjusting a focal length, the application voltages applied to the respective electrodes arranged in the first direction are changed in accordance with the focal length of the zooming lens to change a position where the charge storage region is locally formed.

7. The solid-state imaging device according to claim 4, wherein the potential modulation electrode has first to fourth electrodes whose application voltages are controllable, and
the hybrid pixels include first to fourth hybrid pixels,
and the first to fourth electrodes in the first hybrid pixel are arranged two-dimensionally in the first direction and a second direction orthogonal to the first direction, and
an arrangement of the first to fourth electrodes in the second hybrid pixel and an arrangement of the first to fourth electrodes in the first hybrid pixel are symmetric with respect to the first direction, and
an arrangement of the first to fourth electrodes in the third hybrid pixel and an arrangement of the first to fourth electrodes in the second hybrid pixel are symmetric with respect to the second direction, and
an arrangement of the first to fourth electrodes in the fourth hybrid pixel and an arrangement of the first to fourth electrodes in the third hybrid pixel are symmetric with respect to the first direction, and
the same voltage is applied to the first electrodes, the second electrodes, the third electrodes, and the fourth electrodes of the first to fourth hybrid pixels.

8. The solid-state imaging device according to claim 2, wherein a plurality of pixels including the hybrid pixels are arranged in a light receiving area on which an image of the subject is formed, and
a position where the charge storage region is locally formed is changed in accordance with a position of the hybrid pixel in the light receiving area.

9. The solid-state imaging device according to claims 1, further comprising a microlens, which collects the incident light in the photodiode, for the each hybrid pixel, and wherein
the potential modulation electrode is formed from an opaque material and provided outside of a light collecting area in which the incident light is collected by the microlens.

10. The solid-state imaging device according to claims 9, wherein the potential modulation electrode has a shape with a cutout portion that exposes the light collecting area.

* * * * *